United States Patent
Fujisawa

(10) Patent No.: US 9,914,878 B2
(45) Date of Patent: Mar. 13, 2018

(54) COMPOSITE LIQUID CRYSTAL COMPOSITION, DISPLAY ELEMENT AND ELECTRIC FIELD DETECTOR

(71) Applicant: DIC CORPORATION, Tokyo (JP)

(72) Inventor: Toru Fujisawa, Kita-adachi-gun (JP)

(73) Assignee: DIC CORPORATION, Tokyo (JP)

( * ) Notice: Subject to any disclaimer, the term of this patent is extended or adjusted under 35 U.S.C. 154(b) by 73 days.

(21) Appl. No.: 14/911,893

(22) PCT Filed: Jul. 31, 2014

(86) PCT No.: PCT/JP2014/070190
§ 371 (c)(1),
(2) Date: May 31, 2016

(87) PCT Pub. No.: WO2015/022866
PCT Pub. Date: Feb. 19, 2015

(65) Prior Publication Data
US 2016/0298035 A1    Oct. 13, 2016

(30) Foreign Application Priority Data

Aug. 13, 2013  (JP) ................. 2013-168408

(51) Int. Cl.
| | |
|---|---|
| C09K 19/32 | (2006.01) |
| C09K 19/54 | (2006.01) |
| C08F 220/28 | (2006.01) |
| C09K 19/18 | (2006.01) |
| C09K 19/30 | (2006.01) |
| G02F 1/1334 | (2006.01) |
| G01R 29/12 | (2006.01) |
| G02F 1/13 | (2006.01) |
| G02F 1/1343 | (2006.01) |
| C09K 19/34 | (2006.01) |

(52) U.S. Cl.
CPC .......... *C09K 19/544* (2013.01); *C08F 220/28* (2013.01); *C09K 19/18* (2013.01); *C09K 19/3059* (2013.01); *C09K 19/322* (2013.01); *C09K 19/54* (2013.01); *C09K 19/542* (2013.01); *G01R 29/12* (2013.01); *G02F 1/1309* (2013.01); *G02F 1/1334* (2013.01); *G02F 1/13439* (2013.01); *C09K 2019/181* (2013.01); *C09K 2019/183* (2013.01); *C09K 2019/3063* (2013.01); *C09K 2019/325* (2013.01); *C09K 2019/3422* (2013.01); *C09K 2019/546* (2013.01)

(58) Field of Classification Search
CPC ...................................... C09K 19/32
See application file for complete search history.

(56) References Cited

FOREIGN PATENT DOCUMENTS

JP    2003315761 A  * 11/2003

* cited by examiner

*Primary Examiner* — Chanceity Robinson
(74) *Attorney, Agent, or Firm* — Westerman, Hattori, Daniels & Adrian, LLP

(57) ABSTRACT

The composite liquid crystal composition contains a liquid crystal compound and a polymerizable compound. The liquid crystal compound includes a compound having a biphenyl skeleton including two or three rings, and two or more compounds other than the compound having the biphenyl skeleton. The composition includes polymerizable compound. The ratio of the content (mass) of the one or more compounds selected from the compounds represented by General Formulas (II-a1) and (II-a2) to the compound represented by General Formula (II-b) is 70:30 to 30:70. The total content of the liquid crystal compounds is 65% to 85% by mass, and the total content of the polymerizable compounds is 15% to 35% by mass.

3 Claims, No Drawings

COMPOSITE LIQUID CRYSTAL COMPOSITION, DISPLAY ELEMENT AND ELECTRIC FIELD DETECTOR

TECHNICAL FIELD

The present invention relates to a composite liquid crystal composition containing a liquid crystal compound and a polymerizable compound, a display element, and an electric field detector including a polymer/liquid crystal composite film formed by using the composite liquid crystal composition.

BACKGROUND ART

Since a polymer dispersed liquid crystal display element does not need a polarizing plate, the display element has a merit that a bright display is achieved compared to a liquid crystal display element for a TN, STN, IPS, or VA mode, which uses a polarizing plate. Since the polymer dispersed liquid crystal display element has a simple element configuration, the display element is used for a light shutter such as a light control glass, and a segment display as a clock. Also, since the display element realizes a high definition display, it has been examined to use the display element for a projector, a reflective display, or the like in combination with an active driving element.

In this situation, in the case where it is considered that the polymer dispersed liquid crystal display element is used for mobile devices using active driving such as a mobile phone, a portable game console, and a PDA, it is required for the display element to maintain satisfactory display properties in a wide temperature range because the mobile devices need to be used outdoors. The polymer dispersed liquid crystal display element suitable for this purpose has been suggested (refer to PTL 1).

In addition, if this polymer dispersed liquid crystal display element can be driven at a low voltage, the liquid crystal device used herein is also suitable as a device constituent element of an electric field detector having high sensitivity.

CITATION LIST

Patent Literature

[PTL 1] JP-A-2006-308883

SUMMARY OF INVENTION

Technical Problem

However, a liquid crystal composition used in the polymer dispersed liquid crystal display element disclosed in PTL 1 is a composite liquid crystal composition which contains a liquid crystal compound and a polymerizable compound for forming a polymer. With respect to the liquid crystal compounds, the content of those having a biphenyl skeleton and a terphenyl skeleton, respectively, one having a structure of three rings including a biphenyl skeleton (structure having three phenylene skeletons) or the like is set to be high such that Δn (birefringence index) is not unnecessarily reduced. However, in this case, a driving voltage of the liquid crystal increases. Thus, for example, in order not to increase the content of this liquid crystal compound too much and further to increase Δn higher than a predetermined value, there is a method for setting the content of the liquid crystal compound having a naphthalene ring skeleton to be high. However, by means of this method, stability of the liquid crystal composition with respect to light is decreased.

The present invention has been made taking this problem into consideration, and has an object of providing a composite liquid crystal composition which contains a liquid crystal compound and a polymerizable compound, has sufficiently high Δn (birefringence index) and high photostability, and can constitute a liquid crystal device capable of being driven at a low voltage.

Solution to Problem

As a result of review of combining various liquid crystal compounds and polymerizable compounds in order to solve the aforementioned problem, the present inventors have found that the aforementioned problem can be solved by combining the liquid crystal compounds and the polymerizable compounds to provide a specified composition, thereby completing the present invention.

That is, the present invention is to provide a composite liquid crystal composition that contains a liquid crystal compound and a polymerizable compound, the composition including:

as the liquid crystal compound, a compound having a biphenyl skeleton including two or three rings, and two or more compounds represented by General Formula (I-a) shown below other than the compound having a biphenyl skeleton,

[Chem. 1]

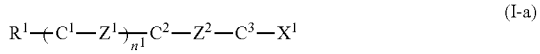

(I-a)

wherein $R^1$ represents an alkyl group having 1 to 10 carbon atoms or an alkenyl group having 2 to 10 carbon atoms, and one or more methylene groups existing in the alkyl group or the alkenyl group may be substituted with an oxygen atom, provided that the oxygen atoms are not directly bonded to each other, $C^1$ represents a 1,4-phenylene group, a 1,4-cyclohexylene group, a 1,3-dioxane-2,5-diyl group, a pyran-1,4-diyl group, or an indane-2,5-diyl group, and the 1,4-phenylene group may be unsubstituted or may have one or more of a fluorine atom, a chlorine atom, a methyl group, a methoxy group, an ethyl group, a trifluoromethyl groups and a trifluoromethoxy group as a substituent, $C^2$ and $C^3$ each independently represent a 1,4-phenylene group, a 1,4-cyclohexylene group, a decahydronaphthalene-2,6-diyl group, a 1,2,3,4-tetrahydronaphthalene-2,6-diyl group, a 2,6-naphthylene group, or an indane-2,5-diyl group, and the 1,4-phenylene group, the 1,2,3,4-tetrahydronaphthalene-2,6-diyl group, the 2,6-naphthylene group, or the indane-2,5-diyl group may be unsubstituted or may have one or more of a fluorine atom, a chlorine atom, a methyl group, a methoxy group, an ethyl group, a trifluoromethyl groups and a trifluoromethoxy group as a substituent, $Z^1$ and $Z^2$ each independently represent a single bond, $-CH_2CH_2-$, $-C\equiv C-$, $-CF_2O-$, $-COO-$, or $-OCO-$, and, in the case where $C^2$ and $C^3$ represent a 1,4-phenylene group, $Z^2$ represents $-CH_2CH_2-$, $-C\equiv C-$, $-CF_2O-$, $-COO-$, or $-OCO-$, $X^1$ represent an alkyl group having 1 to 10 carbon atoms, an alkenyl group having 2 to 10 carbon atoms (one or more methylene groups existing in the alkyl group or the alkenyl group may be substituted with an oxygen atom provided that the oxygen atoms are not directly bonded to each other), a fluorine atom, a chlorine atom, a trifluoromethyl group, a trifluoromethoxy group, a difluoromethyl group, or an isocyanate group, and $n^1$ represents 0, 1, or 2 provided that, in the case where $n^1$ is 2, $C^1$ and $Z^1$ which exist in a plurality of numbers respectively may be the same as or different from each other, and in which the content of the compound having a biphenyl skeleton is 20% by mass or less with respect to the total content of the liquid crystal compounds, and among the compounds represented by General Formula (I-a), the content of the compound in which $C^1$ represents a 1,4-cyclohexylene group and $n^1$ is not 0 is 45% by mass or more with respect to the total content of the liquid crystal compounds; and as the polymerizable compound, one or more compounds selected from the compounds represented by General Formulas (II-a1) and (II-a2) shown below,

[Chem. 2]

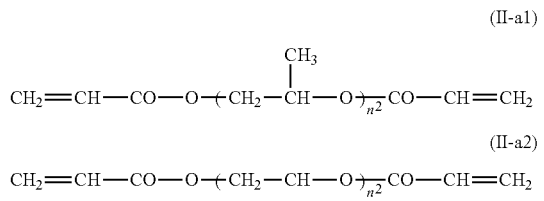

wherein $n^2$ each independently represent an integer of 3 to 14), and a compound represented by General Formula (II-b) shown below,

[Chem. 3]

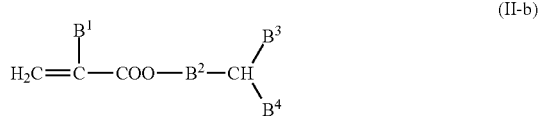

wherein $B^1$ represents a hydrogen atom or a methyl group, $B^2$ represents a single bond or an alkylene group having 1 to 3 carbon atoms, one or more methylene groups existing in the alkylene group may be substituted with an oxygen atom, —CO—, —COO—, or —OCO—, provided that the oxygen atoms are not directly bonded to each other, and one or more hydrogen atoms existing in the alkylene group may be substituted with a fluorine atom, and $B^3$ and $B^4$ each independently represent an alkyl group having 3 to 11 carbon atoms, one or more methylene groups existing in the alkyl group may be substituted with an oxygen atom, —CO—, —COO—, or —OCO—, provided that the oxygen atoms are not directly bonded to each other, and one or more hydrogen atoms existing in the alkyl group may be substituted with a fluorine atom, and in which the ratio of the content (mass) of the one or more compounds selected from the compounds represented by General Formulas (II-a1) and (II-a2) to the compound represented by General Formula (II-b) is 70:30 to 30:70, the total content of the liquid crystal compounds being 65% to 85% by mass, and the total content of the polymerizable compounds being 15% to 35% by mass.

In addition, the present invention is to provide a display element provided with a transparent substrate, a transparent electrode, a polymer/liquid crystal composite film, and a transparent substrate in this order, in which the transparent electrode is capable of being grounded, and the polymer/liquid crystal composite film is formed by using the composite liquid crystal composition.

In addition, the present invention is to provide an electric field detector including: an electric field detecting unit provided with a transparent substrate, a transparent electrode, a polymer/liquid crystal composite film, and a transparent substrate in this order, in which the transparent electrode is capable of being grounded, and the polymer/liquid crystal composite film is formed by using the composite liquid crystal composition.

Advantageous Effects of Invention

According to the present invention, provided is a composite liquid crystal composition containing a liquid crystal compound and a polymerizable compound, which has sufficiently high Δn (birefringence index), further has high photostability, and can constitute a liquid crystal device capable of being driven at a low voltage.

DESCRIPTION OF EMBODIMENTS

Composite Liquid Crystal Composition

The composite liquid crystal composition according to the present invention contains a liquid crystal compound and a polymerizable compound, the composition includes as the liquid crystal compound, a compound having a biphenyl skeleton including two or three rings (hereinafter, may be simply referred to as "compound having a biphenyl skeleton") and two or more compounds represented by General Formula (I-a) shown below other than the compound having a biphenyl skeleton,

[Chem. 4]

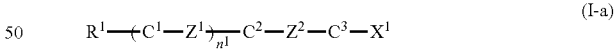

wherein $R^1$ represents an alkyl group having 1 to 10 carbon atoms or an alkenyl group having 2 to 10 carbon atoms, and one or more methylene groups existing in the alkyl group or the alkenyl group have may be substituted with an oxygen atom, provided that the oxygen atoms are not directly bonded to each other and, $C^1$ represents a 1,4-phenylene group, a 1,4-cyclohexylene group, a 1,3-dioxane-2,5-diyl group, a pyran-1,4-diyl group, or an indane-2,5-diyl group, and the 1,4-phenylene group may be unsubstituted or may have one or more of a fluorine atom, a chlorine atom, a methyl group, a methoxy group, an ethyl group, a trifluoromethyl group and a trifluoromethoxy group as a substituent, $C^2$ and $C^3$ each independently represent a 1,4-phenylene group, a 1,4-cyclohexylene group, a decahydronaphthalene- 2,6-diyl group, a 1,2,3,4-tetrahydronaphthalene-2,6-diyl group, a 2,6-naphthylene group, or an indane-2,5-diyl group, and the 1,4-phenylene group, the 1,2,3,4-tetrahydronaphthalene-2,6-diyl group, the 2,6-naphthylene group, or the indane-2,5-diyl group may be unsubstituted or may have one or more of a fluorine atom, a chlorine atom, a methyl group, a methoxy group, an ethyl group, a trifluoromethyl group and a trifluoromethoxy group as a substituent, $Z^1$ and $Z^2$ each independently represent a single bond, —$CH_2CH_2$—, —C≡C—, —$CF_2O$—, —COO—, or —OCO—, and, in the case where $C^2$ and $C^3$ represent a 1,4-phenylene group, $Z^2$ represents —$CH_2CH_2$—, —C≡C—, —$CF_2O$—, —COO—, or —OCO—, $X^1$ represents an alkyl group having 1 to 10 carbon atoms, an alkenyl group having 2 to 10 carbon atoms, a fluorine atom, a chlorine atom, a trifluoromethyl group, a trifluoromethoxy group, a difluoromethyl group or an isocyanate group, and one or more methylene groups existing in the alkyl group or the alkenyl group may be substituted with an oxygen atom, provided that the oxygen atoms are not directly bonded to each other), and $n^1$ represents 0, 1, or 2 provided that, in the case where $n^1$ is 2, $C^1$ and $Z^1$ which exist in a plurality of numbers respectively may be the same as or different from each other), in which the content of the compound having a biphenyl skeleton is 20% by mass or less with respect to the total content of the liquid crystal compounds, and, with respect to the compounds represented by General Formula (I-a), the content of the compound in which $C^1$ represents a 1,4-cyclohexylene group and $n^1$ is not 0 is 45% by mass or more with respect to the total content of the liquid crystal compounds;

as the polymerizable compound, one or more compounds selected from the compounds represented by General Formulas (II-a1) and (II-a2) shown below,

[Chem. 5]

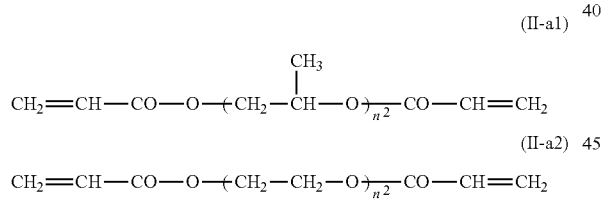

(II-a1)

(II-a2)

wherein $n^2$ each independently represent an integer of 3 to 14), and a compound represented by General Formula (II-b) shown below,

[Chem. 6]

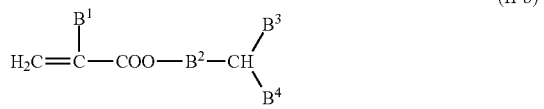

(II-b)

wherein $B^1$ represents a hydrogen atom or a methyl group,
$B^2$ represents a single bond or an alkylene group having 1 to 3 carbon atoms, one or more methylene groups existing in the alkylene group may be substituted with an oxygen atom, —CO—, —COO—, or —OCO—, provided that the oxygen atoms are not directly bonded to each other, and one or more hydrogen atoms existing in the alkylene group may be substituted with a fluorine atom, and $B^3$ and $B^4$ each independently represent an alkyl group having 3 to 11 carbon atoms, one or more methylene groups existing in the alkyl group may be substituted with an oxygen atom, —CO—, —COO—, or —OCO—, provided that the oxygen atoms are not directly bonded to each other, and one or more hydrogen atoms existing in the alkyl group may be substituted with a fluorine atom, in which the ratio of the content (mass) of the one or more compounds selected from the compounds represented by General Formulas (II-a1) and (II-a2) to the compound represented by General Formula (II-b) is 70:30 to 30:70, the total content of the liquid crystal compounds being 65% to 85% by mass, and the total content of the polymerizable compounds being 15% to 35% by mass.

As described above, since the composite liquid crystal composition according to the present invention contains the liquid crystal compounds in a specified combination and the polymerizable compounds in a specified combination each with a specified amount, the composition has sufficiently high Δn (birefringence index). Also, the composition has sufficiently high photostability and is particularly suitable for a configuration of the liquid crystal device capable of being driven at a low voltage.

The compound represented by General Formula (I-a) preferably has a high specific resistance value, high dielectric anisotropy, high refractive index anisotropy, and low viscosity as well as a wide liquid crystal temperature range, and preferably can impart excellent heat resistance and light resistance to the liquid crystal composition. Particularly, in order to be driven by the active element, the compound represented by General Formula (I-a) preferably has a high specific resistance value, high birefringence index, and low viscosity.

The compound represented by General Formula (I-a) is preferably a compound represented by General Formula (IV-a), from the viewpoint of obtaining a wide liquid crystal temperature range, nematic stability and compatibility at a low temperature range, and a high birefringence index and specific resistance value.

[Chem. 7]

(IV-a)

In the formula, $R^{11}$ represents an alkyl group having 1 to 10 carbon atoms or an alkenyl group having 2 to 10 carbon atoms, and one or more methylene groups existing in the alkyl group or the alkenyl group may be substituted with an oxygen atom, provided that the oxygen atoms are not directly bonded to each other, $C^{11}$ represents a 1,4-phenylene group or a 1,4-cyclohexylene group, and the 1,4-phenylene group may be unsubstituted or may have one or more of a fluorine atom, a chlorine atom, a methyl group, a trifluoromethyl group and a trifluoromethoxy group as a substituent, $Z^{11}$ represents a single bond or —$CH_2CH_2$—, $X^{11}$ represents an alkyl group having 1 to 10 carbon atoms, an alkenyl group having 2 to 10 carbon atoms (one or more methylene groups existing in the alkyl group or the alkenyl group have oxygen atoms not directly bonded to each other and may be substituted with an oxygen atom), a fluorine atom, a chlorine atom, an isocyanate group, a trifluoromethyl group, a trifluoromethoxy group, a difluoromethyl group, or General Formula (IV-b).

[Chem. 8]

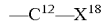

$$—C^{12}—X^{18} \quad\quad\quad\quad\quad\quad (Iv\text{-}b)$$

In the formula, $C^{12}$ represents a 1,4-phenylene group or a 1,4-cyclohexylene group, and the 1,4-phenylene group may be unsubstituted or may have one or more of a fluorine atom, a chlorine atom, a methyl group, a trifluoromethyl group and a trifluoromethoxy group as a substituent, $X^{18}$ represents an alkyl group having 1 to 10 carbon atoms, an alkenyl group having 2 to 10 carbon atoms (one or more methylene groups existing in the alkyl group or the alkenyl group may be substituted with an oxygen atom, provided that the oxygen atoms are not directly bonded to each other), a fluorine atom, a chlorine atom, an isocyanate group, a trifluoromethyl group, a trifluoromethoxy group, or a difluoromethyl group), $X^{12}$ to $X^{11}$ each independently represent a hydrogen atom, a fluorine atom, a chlorine atom, a trifluoromethyl group, a trifluoromethoxy group, a methyl group, a methoxy group or an ethyl group, and $n^{11}$ represents 0 or 1.

A relationship between a driving voltage and light scattering properties of an element including the composite liquid crystal composition conflicts with each other. However, with respect to the compound represented by General Formula (IV-a), in particular, in the case where $n^{11}$ is 1 and $C^1$ represents a 1,4-cyclohexylene group, scattering properties are increased and the driving voltage is decreased, which is preferable. Also, the case where $n^{11}$ is 0 is preferable.

Further, the compound represented by General Formula (IV-a) preferably has a birefringence index of 0.2 to 0.33, in the case where the dielectric anisotropy is positive, 8 to 14 is preferable, and in the case where the dielectric anisotropy is negative, −4 to −7 is preferable.

In General Formula (IV-a), $R^{11}$ is preferably an alkyl group having 1 to 5 carbon atoms or an alkenyl group having 2 to 6 carbon atoms (one or more methylene groups existing in the alkyl group or the alkenyl group may be substituted with an oxygen atom, provided that the oxygen atoms are not directly bonded to each other), and more preferably an alkyl group having 1 to 5 carbon atoms or an alkoxy group having 1 to 5 carbon atoms.

$Z^{11}$ is preferably a single bond.

$X^{11}$ is preferably an alkyl group having 1 to 5 carbon atoms, an alkoxy group having 1 to 5 carbon atoms, or a fluorine atom.

$X^{12}$ to $X^{17}$ are preferably a hydrogen atom, a fluorine atom, or a methyl group, and one to three of $X^{12}$ to $X^{17}$ are more preferably a fluorine atom or a methyl group.

Further, the compound represented by General Formula (IV-a) is preferably compounds represented by General Formula (IV-c) to (IV-i) shown below.

[Chem. 9]

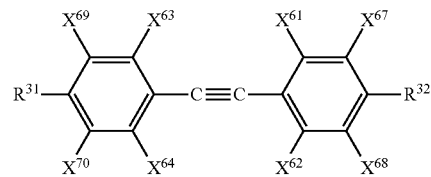

(IV-c)

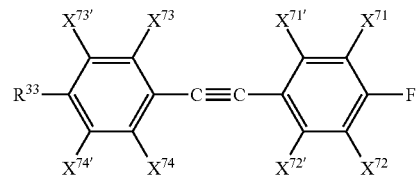

(IV-g)

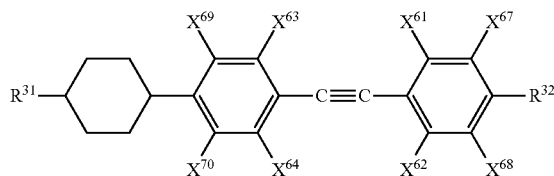

(IV-d)

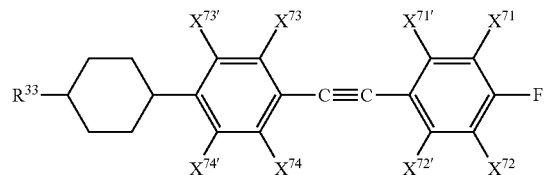

(IV-h)

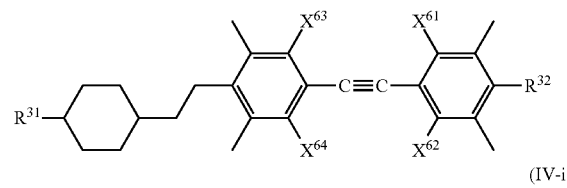

(IV-e)

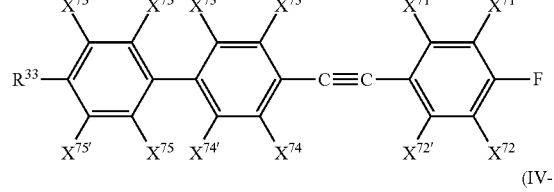

(IV-i)

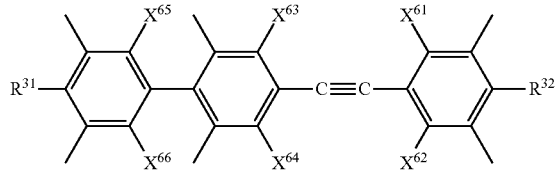

(IV-f)

In the formula, $R^{31}$, $R^{32}$, and $R^{33}$ each independently represent an alkyl group having 1 to 5 carbon atoms or an alkoxy group having 1 to 5 carbon atoms, $X^{61}$ to $X^{65}$ and $X^{70}$ each independently represent a hydrogen atom, a fluorine atom, or a methyl group, and $X^{71}$ to $X^{76}$ and $X^{71'}$ to $X^{76'}$ each independently represent a hydrogen atom or a fluorine atom.

Among these, a compound in which $X^{61}$ to $X^{66}$ and $X^{70}$ are all hydrogen atoms, or a compound in which at least one to three of $X^{61}$ to $X^{68}$ and $X^{70}$ represent a fluorine atom or a methyl group, and at least one to three of $X^{71}$ to $X^{76}$ and $X^{71'}$ to $X^{76'}$ represent a fluorine atom, is more preferable.

Further, the compound represented by General Formula (IV-a) is more preferably compounds represented by General Formulas (IV-j) to (IV-u) shown below.

[Chem. 10]

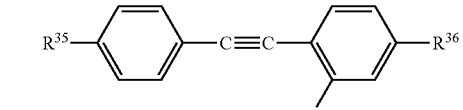
(IV-j)

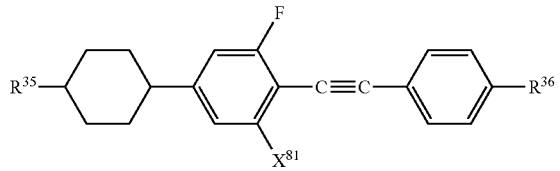
(IV-k)

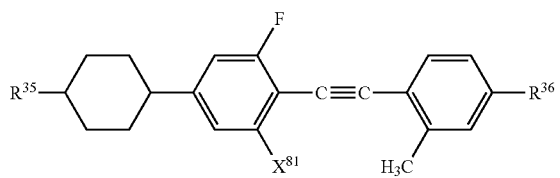
(IV-l)

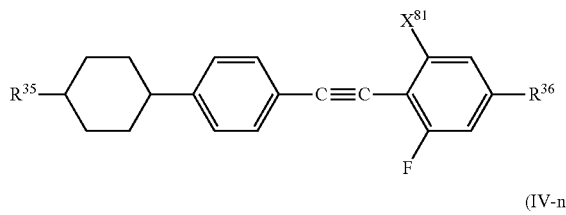
(IV-m)

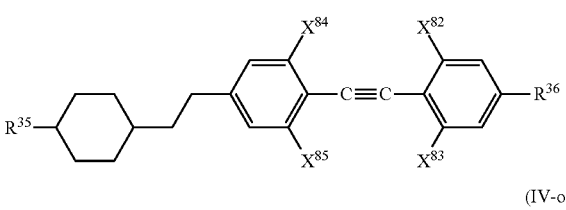
(IV-n)

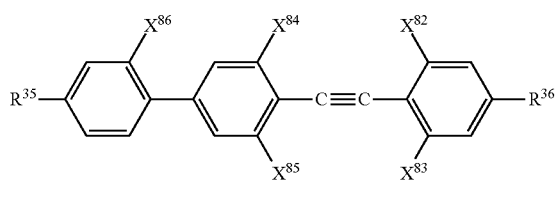
(IV-o)

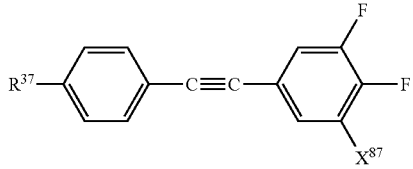
(IV-p)

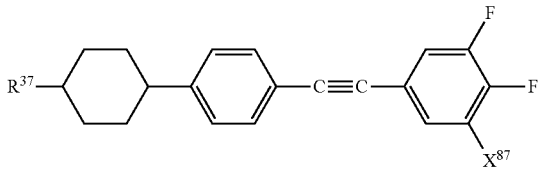
(IV-q)

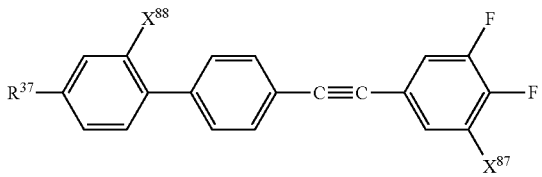
(IV-r)

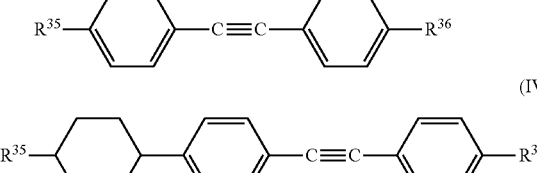
(IV-s)

(IV-t)

(IV-u)

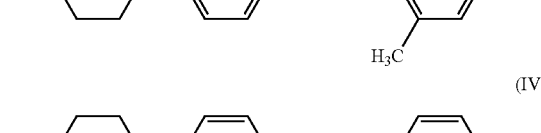

In the formula, $R^{35}$, $R^{36}$, and $R^{37}$ each independently represent an alkyl group having 1 to 5 carbon atoms or an alkoxy group having 1 to 5 carbon atoms, $X^{81}$, $X^{84}$, $X^{85}$, and $X^{86}$ each independently represent a hydrogen atom or a fluorine atom, $X^{82}$ and $X^{83}$ each independently represent a hydrogen atom, a fluorine atom, or a methyl group, but at least one to three of $X^{82}$ to $X^{86}$ in Formulas (IV-n) and (IV-o) represent a fluorine atom or a methyl group, and $X^{87}$ and $X^{88}$ each independently represent a hydrogen atom or a fluorine atom.

The compound represented by General Formula (IV-a) shows a high birefringence index; however, if the compound is applied to a composite liquid crystal composition, a —C≡C— linking group (triple linking groups) in the compound traps radicals generated during polymerization, thereby causing inhibition of polymerization. After polymerization, a large amount of the polymerizable compound (monomer) remains in a liquid crystal, and voltage-transmittance properties are changed over time, which may cause a decrease in reliability. Thus, in order to increase the reliability of the element including a composite liquid crystal film, the content of the compound represented by General Formula (IV-a) is preferably 40% by mass or less with respect to the total content of the liquid crystal compounds.

In the case where the content of the compound represented by General Formula (IV-a) is suppressed, in order to increase the birefringence index of the composite liquid crystal composition, it is necessary to use a compound having a high birefringence index and high dielectric anisotropy, other than the compound represented by General Formula (IV-a), in combination.

The compound represented by General Formula (I-a) is preferably a compound represented by General Formula (V-a) or (V-b) based on the same reason as for the case of the compound represented by General Formula (IV-a).

[Chem. 11]

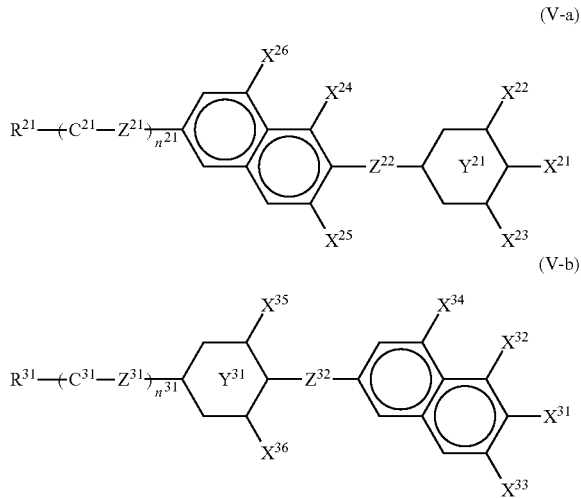

In the formulae, $R^{21}$ and $R^{31}$ each independently represent an alkyl group having 1 to 10 carbon atoms or an alkenyl group having 2 to 10 carbon atoms, and one or more methylene groups existing in the alkyl group or the alkenyl group may be substituted with an oxygen atom, provided that the oxygen atoms are not directly bonded to each other, $C^{21}$ and $C^{31}$ each independently represent a 1,4-phenylene group or a 1,4-cyclohexylene group, and the 1,4-phenylene group may be unsubstituted or may have one or more of a fluorine atom, a chlorine atom, a methyl group, a trifluoromethyl group and a trifluoromethoxy group as a substituent, $Y^{21}$ represents a phenyl group or a cyclohexyl group, $Y^{31}$ represents a 1,4-phenylene group or a 1,4-cyclohexylene group, $X^{22}$ and $X^{31}$ each independently represent a fluorine atom, a chlorine atom, an isocyanate group, a trifluoromethyl group, a trifluoromethoxy group, or a difluoromethyl group, $X^{22}$ to $X^{26}$ and $X^{32}$ to $X^{36}$ each independently represent a hydrogen atom, a fluorine atom, a chlorine atom, a trifluoromethyl group, or a trifluoromethoxy group, $Z^{21}$ and $Z^{31}$ each independently represent a single bond or $-CH_2CH_1-$, $Z^{22}$ and $Z^{32}$ each independently represent a single bond, $-CH_2CH_2-$, or $-CF_2O-$, and $n^{21}$ and $n^{31}$ represent 0 or 1.

The compound represented by General Formulas (V-a) and (V-b) each have an advantage in that both the high dielectric anisotropy (9 to 22) and the high birefringence index (0.12 to 0.33) are obtained, and is preferably useful in obtaining the high birefringence index and the high dielectric anisotropy by combining the compound with the compound of General Formula (IV-a). In particular, a compound having 4 or more fluorine atoms and exhibiting a dielectric anisotropy of 15 or more is preferable. However, the compounds represented by General Formulas (V-a) and (V-b) have high crystallinity, and thus may have a high melting point. In this case, since the viscosity is increased, the content of the compound represented by General Formula (V-a) or (V-b) is preferably 25% or less with respect to the total content of the liquid crystal compounds.

In General Formulas (V-a) and (V-b), for $R^{21}$ and $R^{31}$, an alkyl group having 1 to 5 carbon atoms or an alkenyl group having 2 to 6 carbon atoms (one or more methylene groups existing in the alkyl group or the alkenyl group may be substituted with an oxygen atom, provided that the oxygen atoms are not directly bonded to each other) is preferable, the alkenyl group is preferably a structure represented by Formula (V-c) shown below.

[Chem. 12]

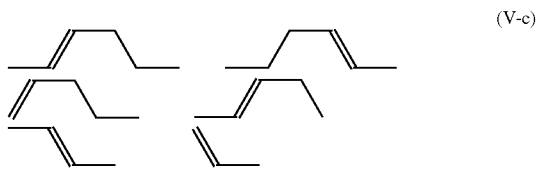

Each structural formula is directly bonded to a ring at a right terminal or bonded to a ring via an oxygen atom), and the alkyl group having 1 to 5 carbon atoms is more preferable.

In General Formulas (V-a) and (V-b), $C^{21}$ and $C^{31}$ are preferably a 1,4-cyclohexylene group.

$Z^{21}$ and $Z^{31}$ are preferably a single bond.

$X^{21}$ and $X^{31}$ are preferably a fluorine atom or a trifluoromethoxy group and more preferably a fluorine atom.

The compound represented by General Formula (V-b) is preferable because, in the case where $n^{31}$ is 1 and $C^{31}$ represents a 1,4-cyclohexylene group, the photostability is satisfactory and the driving voltage is not increased in the composite liquid crystal composition. In addition, in the case where $n^{31}$ is 0, $Y^{31}$ represents a 1,4-phenylene group having a fluorine atom, if the compound in which the birefringence index is 0.15 or more, the dielectric anisotropy is 15 or more, and the melting point is 70° C. or less is used, in the composite liquid crystal composition, solubility is increased and the melting point is decreased, which are effective to realize the high dielectric anisotropy and birefringence index, and thus the compound is preferable.

Further, the compound represented by General Formula (V-a) or (V-b) is preferably compounds represented by General Formulas (V-1) to (V-33).

[Chem. 13]

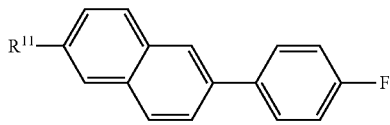

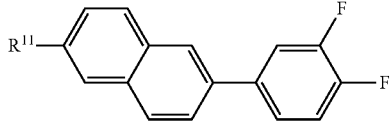

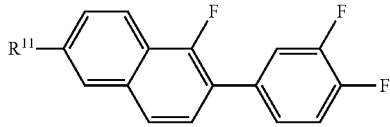

-continued
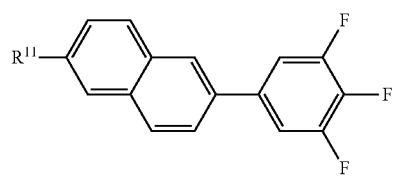
(V-4)
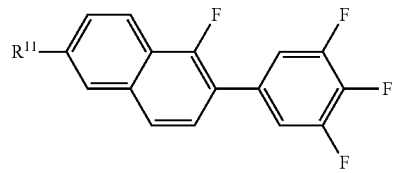
(V-5)
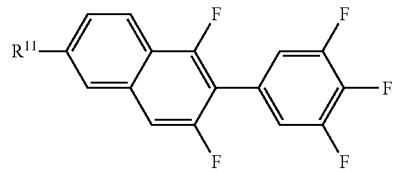
(V-6)
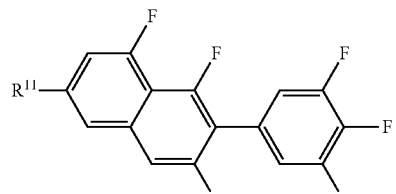
(V-7)
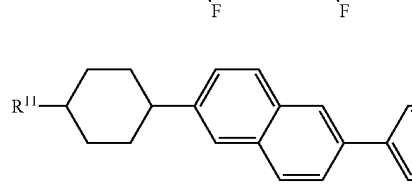
(V-8)
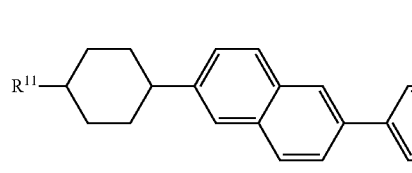
(V-9)
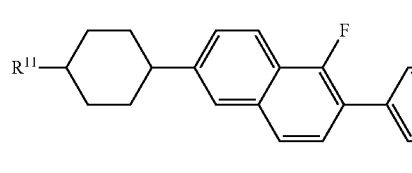
(V-10)
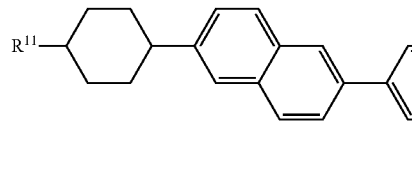
(V-11)
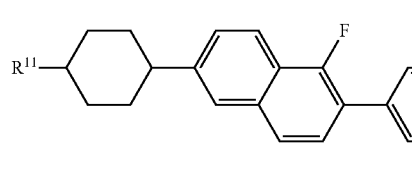
(V-12)
-continued
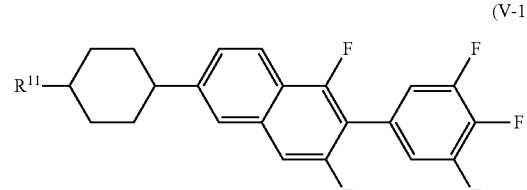
(V-13)
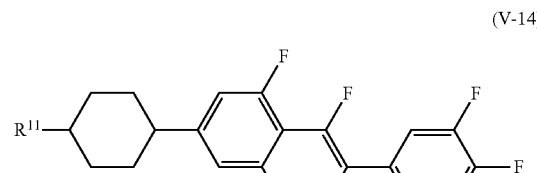
(V-14)
In the formulas, $R^{11}$ represents an alkyl group having 1 to 5 carbon atoms.
[Chem. 14]
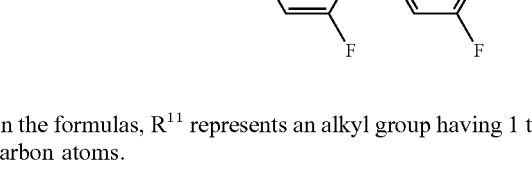
(V-15)
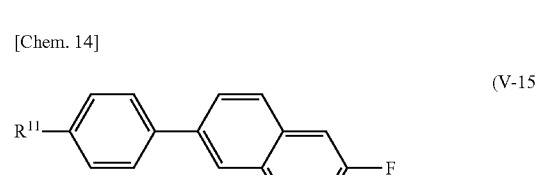
(V-16)
(V-17)
(V-18)
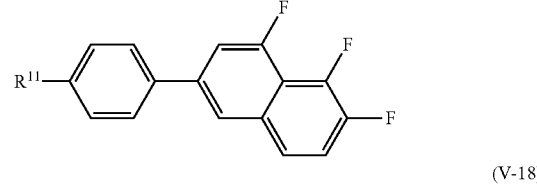
(V-19)
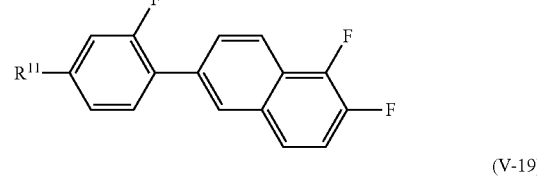
(V-20)
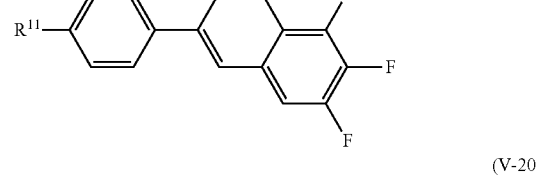
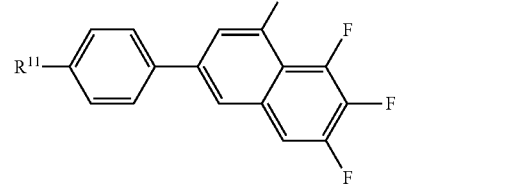

(V-21)
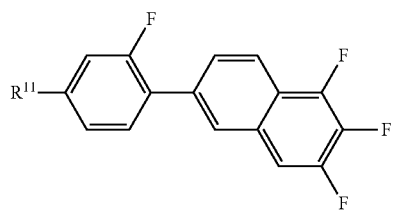
(V-22)
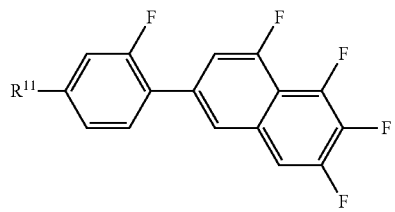
(V-23)
(V-24)
(V-25)
(V-26)
(V-27)
(V-28)
(V-29)
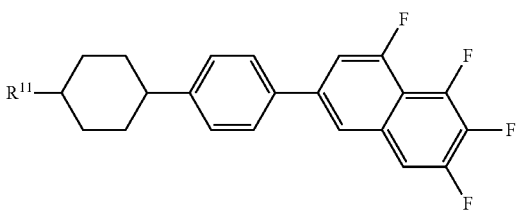
(V-30)
(V-31)
(V-32)
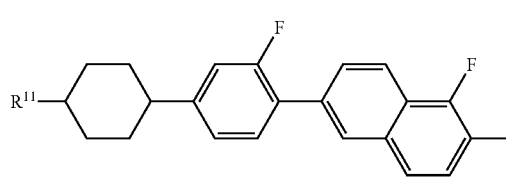
(V-33)
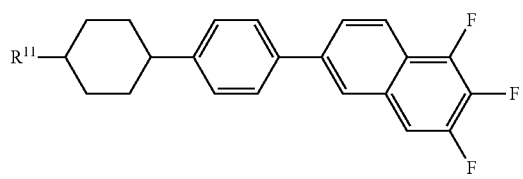
In the formulas, R¹¹ represents an alkyl group having 1 to 5 carbon atoms.
The compound represented by General Formula (I-a) is preferably a compound represented by General Formula (VI-a) or (VI-b) shown below based on the same reason as the case of the compound represented by General Formula (IV-a).

[Chem. 15]

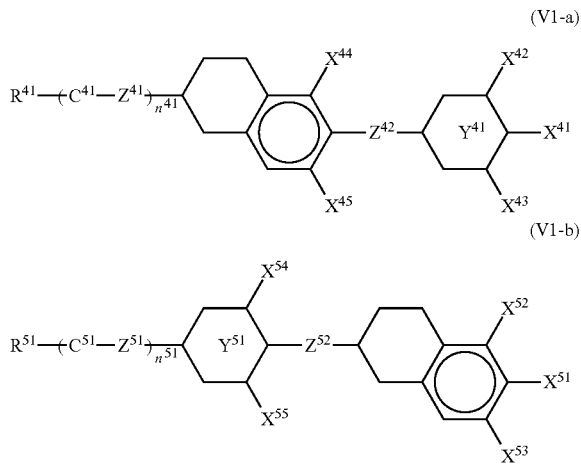

In the formula, $R^{41}$ and $R^{51}$ each independently represent an alkyl group having 1 to 10 carbon atoms or an alkenyl group having 2 to 10 carbon atoms, and one or more methylene groups existing in the alkyl group or the alkenyl group may be substituted with an oxygen atom, provided that the oxygen atoms are not directly bonded to each other, $C^{41}$ and $C^{51}$ each independently represent a 1,4-phenylene group or a 1,4-cyclohexylene group, and the 1,4-phenylene group may be unsubstituted or may have one or more of a fluorine atom, a chlorine atom, a methyl group, a trifluoromethyl group and a trifluoromethoxy group as a substituent, $Y^{41}$ represents a phenyl group or a cyclohexyl group, $Y^{51}$ represents a 1,4-phenylene group or a 1,4-cyclohexylene group, $X^{41}$ and $X^{51}$ each independently represent a fluorine atom, a chlorine atom, an isocyanate group, a trifluoromethyl group, a trifluoromethoxy group, or a difluoromethyl group, $X^{42}$ to $X^{45}$ and $X^{52}$ to $X^{55}$ each independently represent a hydrogen atom, a fluorine atom, a chlorine atom, a trifluoromethyl group, or a trifluoromethoxy group, $Z^{41}$ and $Z^{51}$ each independently represent a single bond or $—CH_2CH_2—$, $Z^{42}$ and $Z^{52}$ each independently represent a single bond, $—CH_2CH_2—$, or $—CF_2O—$, and $n^{41}$ and $n^{51}$ represent 0 or 1.

In particular, the compounds represented by General Formulas (VI-a) and (VI-b), in which the dielectric anisotropy is 17 or more and the melting point is 50° C. or less, are useful, and in the composite liquid crystal composition, the solubility is increased and the melting point is decreased, which are effective to realize high dielectric anisotropy, and thus the compounds are preferable. However, since there are many compounds represented by General Formulas (VI-a) and (VI-b) in which the birefringence index is 0.13 or less, and the compounds have an effect of decreasing the birefringence index, the content of the compound represented by General Formula (VI-a) or (VI-b) is preferably 25% or less with respect to the total content of the liquid crystal compounds. In addition, if the content is set as the above, in a composite liquid crystal element using the composite liquid crystal composition, the action of the high dielectric anisotropy has an effect of decreasing a driving voltage, which is preferable.

In General Formulas (VI-a) and (VI-b), $R^{41}$ and $R^{31}$ are preferably an alkyl group having 1 to 5 carbon atoms or an alkenyl group having 2 to 6 carbon atoms (one or more methylene groups existing in the alkyl group or the alkenyl group may be substituted with an oxygen atom, provided that the oxygen atoms are not directly bonded to each other), the alkenyl group is preferably a structure represented by Formula (VI-c).

[Chem. 16]

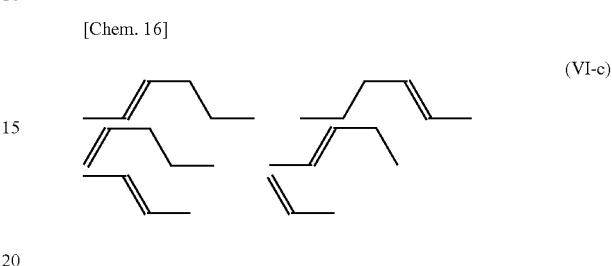

Each structural formula is directly bonded to a ring at a right terminal or bonded to a ring via an oxygen atom, and the alkyl group having 1 to 5 carbon atoms is more preferable.

In General Formulas (VI-a) and (VI-b), $C^{41}$ and $C^{51}$ are preferably a 1,4-cyclohexylene group.

$Z^{41}$ and $Z^{51}$ are preferably a single bond.

$X^{41}$ and $X^{51}$ are preferably a fluorine atom or a trifluoromethoxy group and the fluorine atom is more preferable.

Further, the compound represented by General Formula (VI-a) or (VI-b) is preferably compounds represented by General Formulas (VI-1) to (VI-42) shown below.

[Chem. 17]

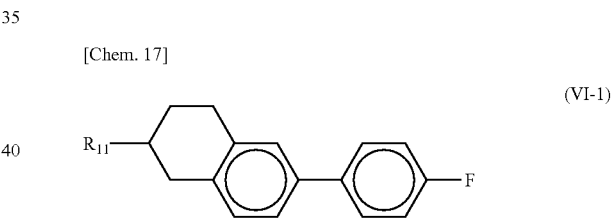

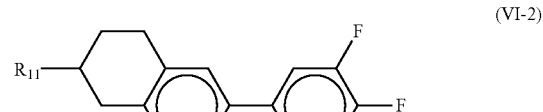

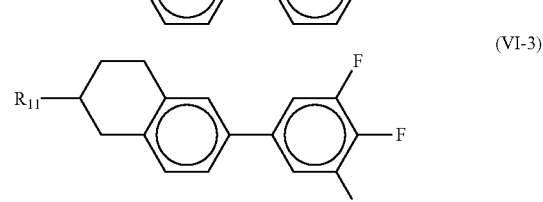

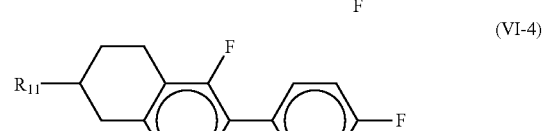

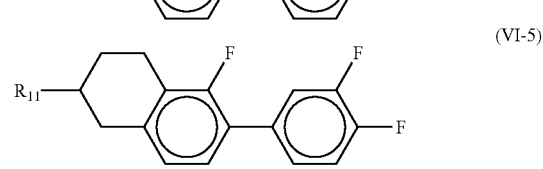

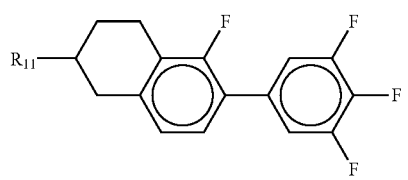 (VI-6)
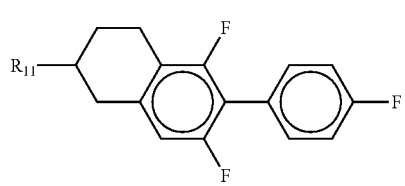 (VI-7)
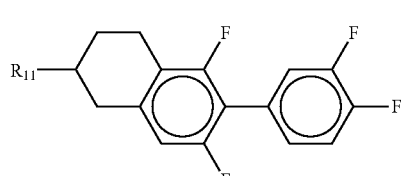 (VI-8)
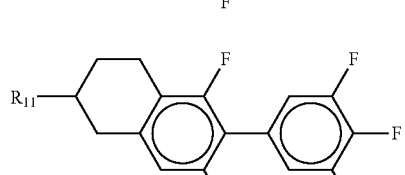 (VI-9)
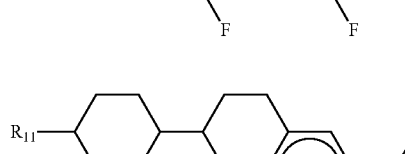 (VI-10)
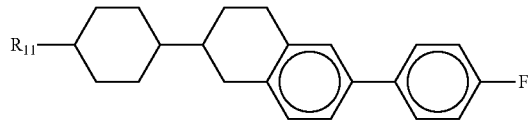 (VI-11)
 (VI-12)
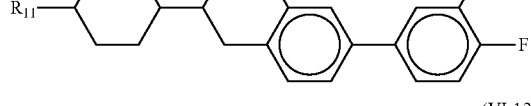 (VI-13)
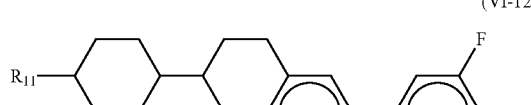 (VI-14)
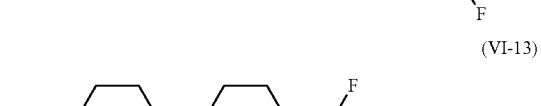 (VI-15)
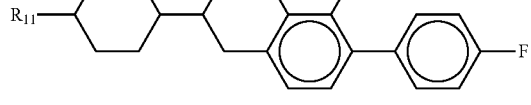 (VI-16)
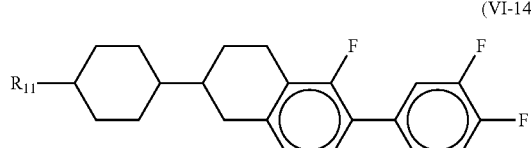 (VI-17)
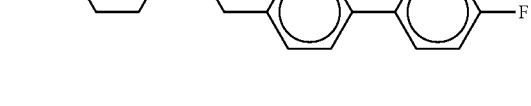 (VI-18)
[Chem. 18]
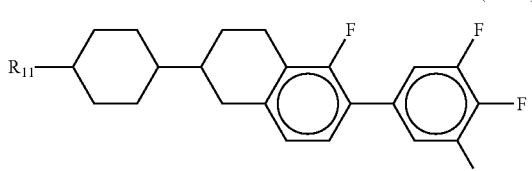 (VI-19)
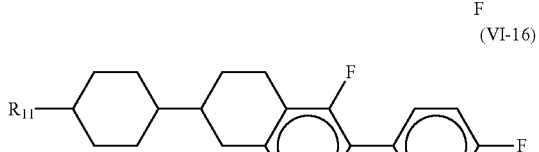 (VI-20)
 (VI-21)
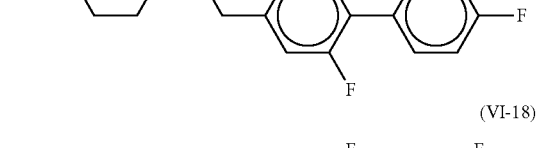 (VI-22)
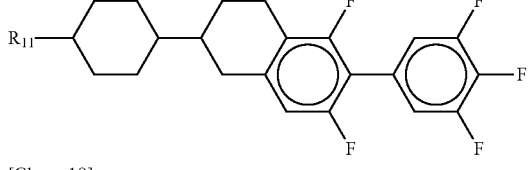 (VI-23)

(VI-24)
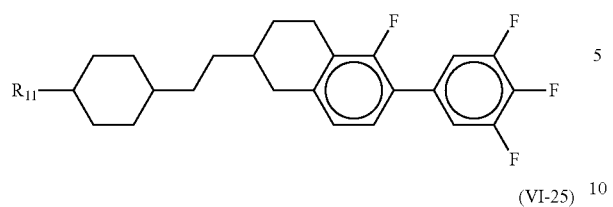
(VI-25)
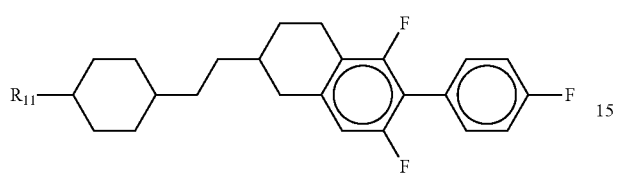
(VI-26)
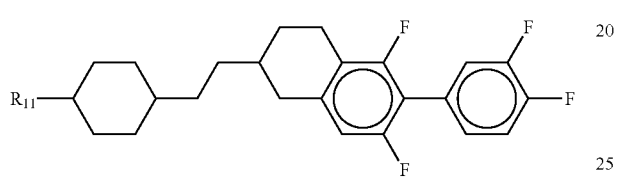
(VI-27)
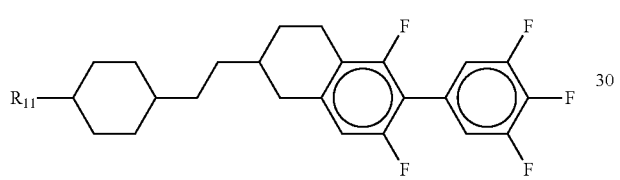
(VI-28)
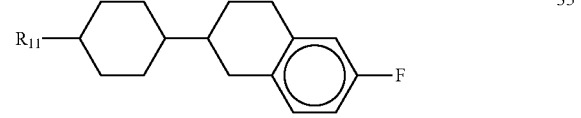
(VI-29)
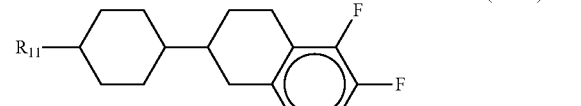
(VI-30)
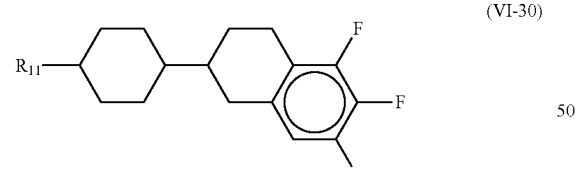
(VI-31)
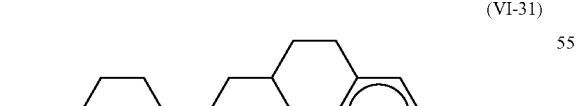
(VI-32)
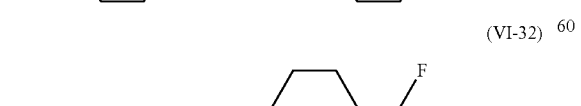
(VI-33)
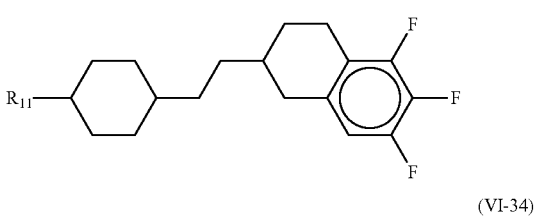
(VI-34)
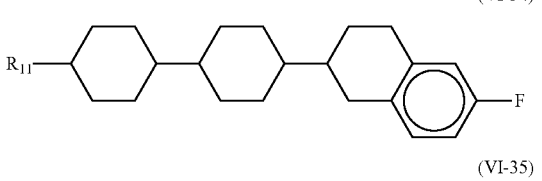
(VI-35)
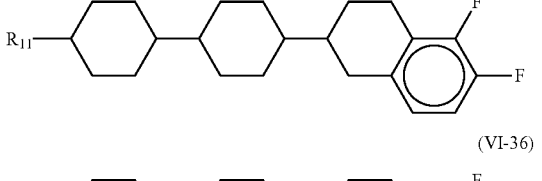
(VI-36)
(VI-37)
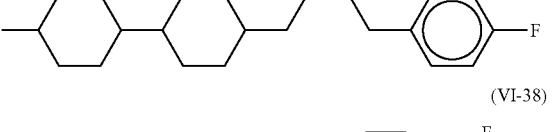
(VI-38)
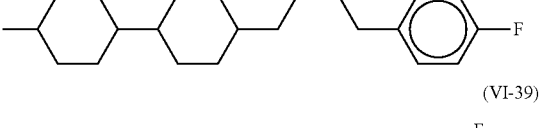
(VI-39)
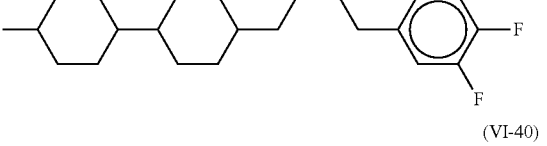
(VI-40)
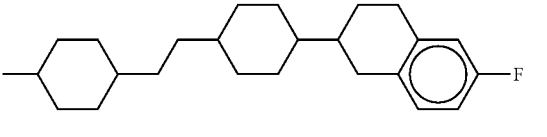
(VI-41)
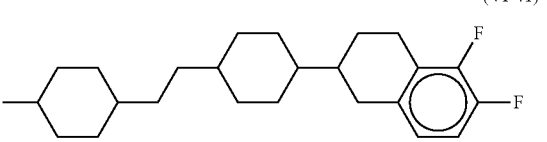

(VI-42)

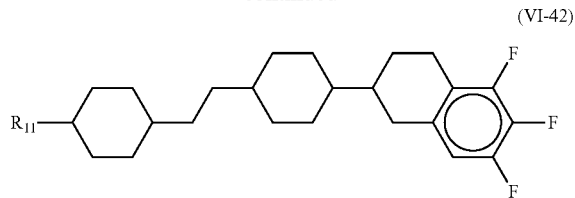

In the formulas, $R^{11}$ represents an alkyl group having 1 to 5 carbon atoms.

In addition, the composite liquid crystal composition preferably contains a compound represented by General Formula (VIII-a) shown below, in addition to the compounds represented by General Formulas (IV-a), (V-a), (V-b), (VI-a), and (VI-b), in order to further expand the liquid crystal temperature range and obtain a high dielectric constant or low viscosity.

[Chem. 19]

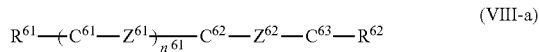
(VIII-a)

In the formula, $R^{61}$ and $R^{62}$ each independently represent an alkyl group having 1 to 10 carbon atoms or an alkenyl group having 2 to 10 carbon atoms, and one or more methylene groups existing in the alkyl group or the alkenyl group may be substituted with an oxygen atom, provided that the oxygen atoms are not directly bonded to each other, $C^{61}$, $C^{62}$, and $C^{63}$ each independently represent a 1,4-phenylene group or a 1,4-cyclohexylene group, and the 1,4-phenylene group may be unsubstituted or may have one or more of a fluorine atom, a chlorine atom, a methyl group, a trifluoromethyl group and a trifluoromethoxy group as a substituent, $Z^{61}$ and $Z^{62}$ each independently represent a single bond or —$CH_2CH_2$—, and $n^{61}$ represents 0, 1, or 2 provided that, in the case where $n^{61}$ is 2, $C^{61}$ and $Z^{61}$ which exist in a plurality of numbers respectively may be the same as or different from each other.

In General Formula (VIII-a), $R^{61}$ and $R^{62}$ are preferably an alkyl group having 1 to 5 carbon atoms or an alkenyl group having 2 to 6 carbon atoms (one or more methylene groups existing in the alkyl group or the alkenyl group may be substituted with an oxygen atom, provided that the oxygen atoms are not directly bonded to each other), the alkenyl group is preferably a structure represented by Formula (V-c), and the alkyl group having 1 to 5 carbon atoms or an alkoxy group is more preferable.

In addition, in particular, in the case where it is desired to obtain low viscosity, it is preferable that $n^{61}$ is 0, $C^{62}$ and $C^{63}$ represent a 1,4-cyclohexylene group, and $Z^{62}$ is a single bond.

In addition, in particular, in the case where it is desired to expand the liquid crystal temperature range, it is preferable that $n^{61}$ is 0 or 1, $C^{61}$ and $C^{62}$ represent a 1,4-cyclohexylene group, $C^{63}$ is a 1,4-phenylene group (the 1,4-phenylene group may be unsubstituted or may have one or more of a fluorine atom and a methyl group as a substituent), $Z^{61}$ is a single bond or —$CH_2CH_2$—, and $Z^{62}$ is a single bond.

In addition, in particular, in the case where it is desired to obtain a high refractive index, it is preferable that $n^{61}$ is 1, $C^{61}$ is a 1,4-cyclohexylene group, or a 1,4-phenylene group (the 1,4-phenylene group may be unsubstituted or may have one or more of a fluorine atom and a methyl group as a substituent), $C^{62}$ and $C^{63}$ represent a 1,4-phenylene group (the 1,4-phenylene group may be unsubstituted or may have one or more of a fluorine atom and a methyl group as a substituent).

Further, the compound represented by General Formula (VIII-a) is more preferably one or more compounds selected from the group consisting of compounds represented by General Formulas (LC6-a) to (LC6-m) shown below.

[Chem. 20]

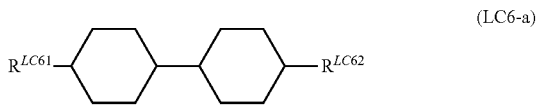
(LC6-a)

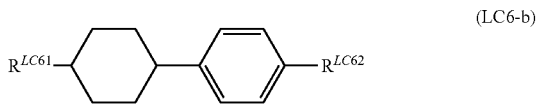
(LC6-b)

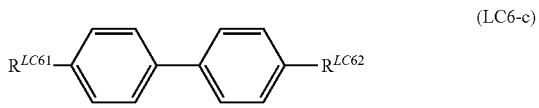
(LC6-c)

(LC6-d)

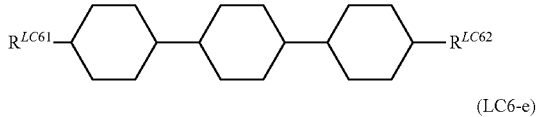
(LC6-e)

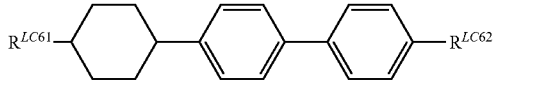
(LC6-f)

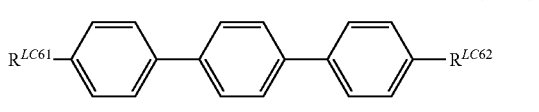
(LC6-g)

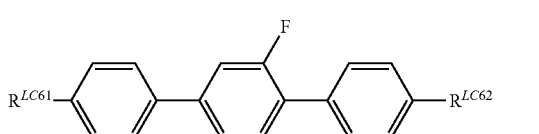
(LC6-h)

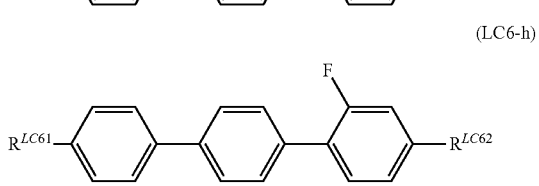
(LC6-i)

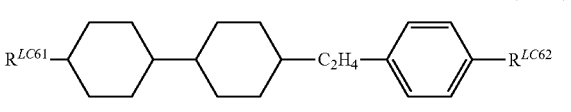
(LC6-j)

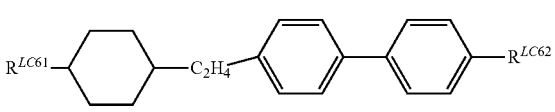

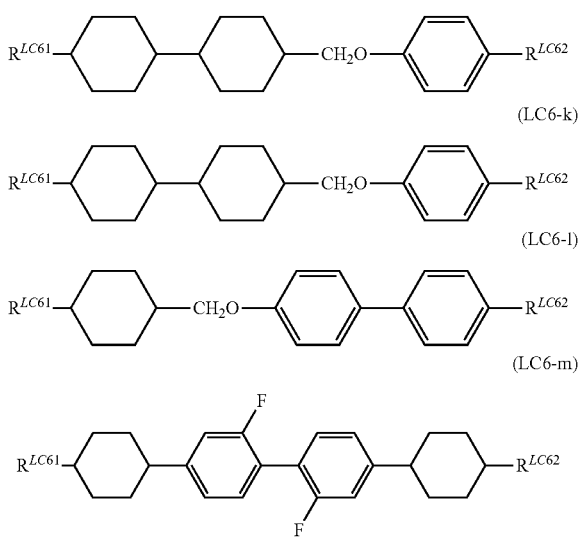

In the formulas, $R^{LC61}$ and $R^{LC62}$ each independently represent an alkyl group having 1 to 7 carbon atoms, an alkoxy group having 1 to 7 carbon atoms, an alkenyl group having 2 to 7 carbon atoms, or an alkenyloxy group having 2 to 7 carbon atoms.

In addition, the composite liquid crystal composition preferably contains a compound represented by General Formula (IX-a) shown below, in addition to the compounds represented by General Formulas (IV-a), (V-a), (V-b), (VI-a), and (VI-b), in order to further expand the liquid crystal temperature range and obtain a high birefringence index or low viscosity.

[Chem. 21]

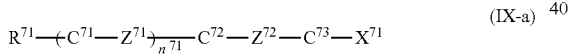

(IX-a)

In the formula, $R^{71}$ represent an alkyl group having 1 to 10 carbon atoms or an alkenyl group having 2 to 10 carbon atoms, and one or more methylene groups existing in the alkyl group or the alkenyl group may be substituted with an oxygen atom, provided that the oxygen atoms are not directly bonded to each other, $C^{71}$, $C^{72}$, and $C^{73}$ each independently represent a 1,4-phenylene group, a 1,4-cyclohexylene group, or an indane-2,5-diyl group, and the 1,4-phenylene group or indane-2,5-diyl group may be unsubstituted or may have one or more of a fluorine atom, a chlorine atom, a methyl group, a trifluoromethyl group and a trifluoromethoxy group as a substituent, $Z^{71}$ and $Z^{72}$ each independently represent a single bond, —$CH_2CH_2$—, or —$CF_2O$—, $X^{71}$ represents a fluorine atom, a chlorine atom, a trifluoromethyl group, a trifluoromethoxy group, a difluoromethyl group, or an isocyanate group, and $n^{71}$ represents 0, 1, or 2 provided that in the case where $n^{72}$ is 2, $C^{71}$ and $Z^{71}$ which exist in a plurality of numbers respectively may be the same as or different from each other.

In General Formula (IX-a), $R^{71}$ is preferably an alkyl group having 1 to 5 carbon atoms or an alkenyl group having 2 to 6 carbon atoms (one or more methylene groups existing in the alkyl group or the alkenyl group may be substituted with an oxygen atom, provided that the oxygen atoms are not directly bonded to each other), the alkenyl group is preferably a structure represented by Formula (V-c), and the alkyl group having 1 to 5 carbon atoms or the alkoxy group having 1 to 5 carbon atoms is more preferable.

$X^{71}$ is preferably a fluorine atom or a trifluoromethoxy group and the fluorine atom is more preferable.

In addition, in particular, in the case where it is desired to obtain the high dielectric constant, it is preferable that $n^{71}$ is 0 or 1, $C^{71}$ is a 1,4-cyclohexylene group, $C^{72}$ is a 1,4-cyclohexylene group or a 1,4-phenylene group (the 1,4-phenylene group may be unsubstituted or may have one or more of a fluorine atom and a methyl group as a substituent), $C^{73}$ is a 2-fluoro-1,4-phenylene group, a 3-fluoro-1,4-phenylene group, a 2,6-difluoro-1,4-phenylene group, or a 3,5-difluoro-1,4-phenylene group, and $Z^{71}$ and $Z^{72}$ represent a single bond.

In addition, in particular, in the case where it is desired to expand the liquid crystal temperature range, it is preferable that $n^{71}$ is 2, $C^{71}$ is a 1,4-cyclohexylene group, $C^{72}$ is a 1,4-cyclohexylene group or a 1,4-phenylene group, $C^{73}$ is a 2-fluoro-1,4-phenylene group, a 3-fluoro-1,4-phenylene group, a 2,6-difluoro-1,4-phenylene group, or a 3,5-difluoro-1,4-phenylene group, and $Z^{71}$ and $Z^{72}$ represent a single bond or —$CH_2CH_2$—.

Further, the compound represented by General Formula (IX-a) is preferably one or more compounds selected from the group consisting of compounds represented by General Formulas (LC1-a) to (LC1-c) shown below.

[Chem. 22]

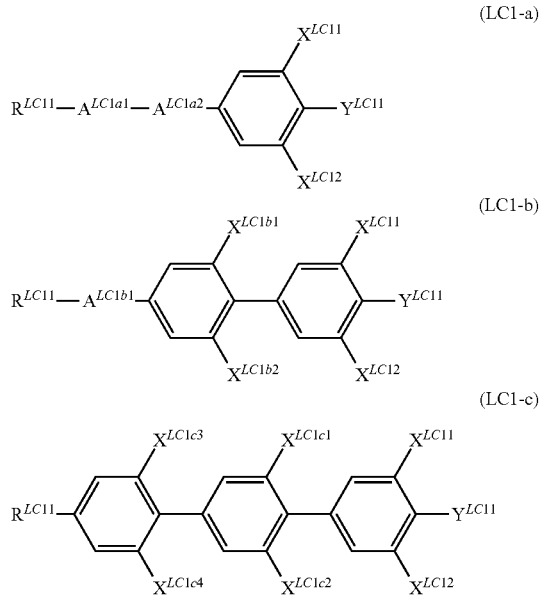

In the formulas, $R^{LC11}$, $Y^{LC11}$, $X^{LC11}$, and $X^{LC12}$ each independently represent the same meaning as $R^{LC11}$, $Y^{LC11}$, $X^{LC11}$, and $X^{LC12}$ in General Formula (LC1), $A^{LC1a1}$, $A^{LC1a2}$, and $A^{LC1b1}$ represent a trans-1,4-cyclohexylene group, a tetrahydropyran-2,5-diyl group, or a 1,3-dioxane-2,5-diyl group, and $X^{LC1b1}$, $X^{LC1b2}$, $X^{LC1c1}$ to $X^{LC1c4}$ each, independently represent a hydrogen atom, Cl, F, $CF_3$, or $OCF_3$.

Each $R^{LC11}$ independently preferably is an alkyl group having 1 to 7 carbon atoms, an alkoxy group having 1 to 7 carbon atoms, or an alkenyl group having 2 to 7 carbon atoms; and an alkyl group having 1 to 5 carbon atoms, an alkoxy group having 1 to 5 carbon atoms, an alkenyl group having 2 to 5 carbon atoms is more preferable.

$X^{LC11}$ to $X^{LC1c4}$ each independently preferably is a hydrogen atom or F.

Each $Y^{LC11}$ independently preferably is F, $CF_3$, or $OCF_3$.

Also, General Formula (LC1) is preferably one or more compounds selected from the group consisting of compounds represented by General Formulas (LC1-d) to (LC1-m) shown below.

[Chem. 23]

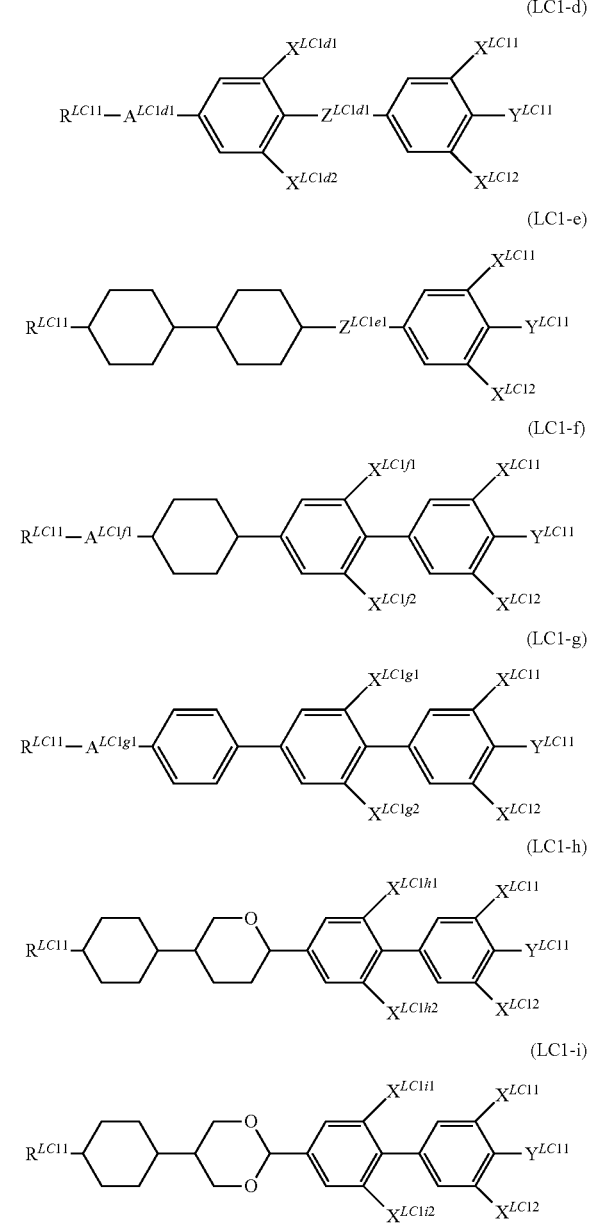

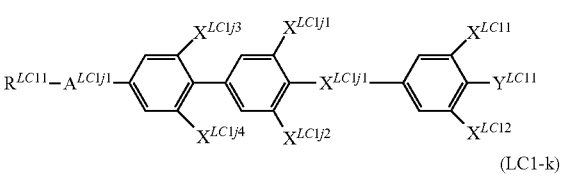

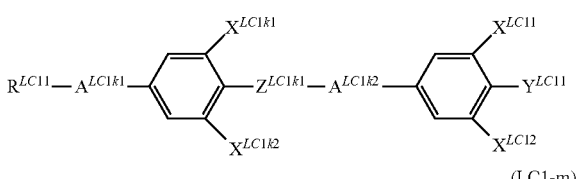

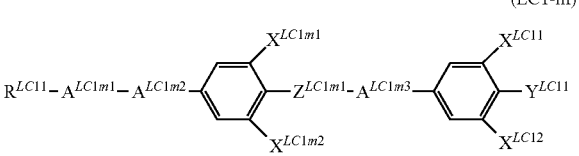

In the formulas, $R^{LC11}$, $Y^{LC11}$, $X^{LC11}$, and $X^{LC12}$ each independently represent the same meaning as $R^{LC11}$, $Y^{LC11}$, $X^{LC11}$, and $X^{LC12}$ in General Formula (LC1); $A^{LC1d1}$, $A^{LC1f1}$, $A^{LC1g1}$, $A^{LC1j1}$, $A^{LC1k1}$, $A^{LC1k2}$, $A^{LC1m1}$ to $A^{LC1m3}$ represent a 1,4-phenylene group, a trans-1,4-cyclohexylene group, a tetrahydropyran-2,5-diyl group, or a 1,3-dioxane-2,5-diyl group; $X^{LC1d1}$, $X^{LC1d2}$, $X^{LC1f1}$, $X^{LC1f2}$, $X^{LC1g1}$, $X^{LC1g2}$, $X^{LC1h1}$, $X^{LC1h2}$, $X^{LC1i1}$, $X^{LC1i2}$, $X^{LC1j1}$ to $X^{LC1j4}$, $X^{LC1k1}$, $X^{LC1k2}$, $X^{LC1m1}$, and $X^{LC1m2}$ each independently represent a hydrogen atom, Cl, F, $CF_3$, or $OCF_3$; and $Z^{LC1d1}$, $Z^{LC1e1}$, $Z^{LC1j1}$, $Z^{LC1k1}$, and $Z^{LC1m1}$ each independently represent a single bond, —CH=CH—, —CF=CF—, —C≡C—, —CH$_2$CH$_2$—, —(CH$_2$)$_4$—, —OCH$_2$—, —CH$_2$O—, —OCF$_2$—, —CF$_2$O—, —COO—, or —OCO—). Each $R^{LC11}$ independently preferably is an alkyl group having 1 to 7 carbon atoms, an alkoxy group having 1 to 7 carbon atoms, or an alkenyl group having 2 to 7 carbon atoms; and an alkyl group having 1 to 5 carbon atoms, an alkoxy group having 1 to 5 carbon atoms, or an alkenyl group having 2 to 5 carbon atoms is more preferable.

$X^{LC11}$ to $X^{LC1m2}$ each independently preferably is a hydrogen atom or F.

Each $Y^{LC11}$ independently preferably is F, $CF_3$, or $OCF_3$. $Z^{LC1d1}$ to $Z^{LC1m1}$ each independently preferably is —CF$_2$O— or —OCH$_2$—.

The composite liquid crystal composition containing these liquid crystal compounds may be subjected to a refining treatment by silica, alumina, or the like for the purpose of removing impurities or further increasing a specific resistance value. Also, the specific resistance value is preferably $10^{12}$ Ω·cm or more and more preferably $10^{13}$ Ω·cm or more.

Further, it is possible to add a dopant such as a chiral compound, a dichroic pigment, and a dye to the composite liquid crystal composition depending on the purpose.

The type of the compounds represented by General Formula (I-a) contained in the composite liquid crystal composition is two or more, and the effect of the present invention is exhibited sufficiently by combining a plurality of types of the compounds.

In the composite liquid crystal composition, among the compounds represented by General Formula (I-a), the content of the compound in which $C^1$ represents a 1,4-cyclohexylene group and $n^1$ is not 0 is preferably 45% by mass to 80% by mass with respect to the total content of the liquid crystal compounds. As such, if the content of the compound in which $C^1$ is a 1,4-cyclohexylene group is within the particular range, in the composite liquid crystal composition, at least Δn (birefringence index) is 0.16 or more which is sufficiently high, and the dielectric anisotropy is 6 or more. Further, in the composite liquid crystal element, the photostability is increased, the light scattering is strong, and thus the element is suitable for a configuration of the liquid crystal device capable of being driven at a low voltage.

The compound having a biphenyl skeleton including two or three rings may be a compound having a structure in which two or three phenylene groups (the phenylene group may be unsubstituted or may have one or more substituents) are linked to each other, and if this condition is satisfied, the compound may fall under the compound, represented by General Formula (I-a) described previously. Here, preferred examples or the substituent include a fluorine atom, a chlorine atom, a methyl group, a methoxy group, an ethyl group, a trifluoromethyl group, and a trifluoromethoxy group.

Examples of the compound having a biphenyl skeleton and represented by General Formula (I-a) include compounds in which one or more of $—C^1—Z^1—C^1—$, $—C^1—Z^1—C^2—$, and $—C^2—Z^2—C^3—$ in General Formula (I-a) are biphenyl skeletons (biphenyl group, or biphenyl group having one or more of a fluorine atom, a chlorine atom, a methyl group, a methoxy group, an ethyl group, a trifluoromethyl group and a trifluoromethoxy group as a substituent). However, in the case where $—C^1—Z^1—C^1—$ or $—C^1—Z^1—C^2—$ is a biphenyl skeleton, $n^1$ is 1 or 2. The content of these is preferably 0 to 20% with respect to the total content of the liquid crystal compounds.

Further, preferred examples of the compound having a biphenyl skeleton and which falls under the compound represented by General Formula (I-a) respectively include, among the compounds represented by General. Formula (IV-a), a compound in which $n^{11}$ is 1, $C^{11}$ is a 1,4-cyclohexylene group and $Z^{11}$ is a single bond, and a compound in which $X^{11}$ is a group represented by General Formula (TV-b) and $C^{12}$ is a 1,4-phenylene group (the 1,4-phenylene group may have one or more of a fluorine atom, a chlorine atom, a methyl group, a trifluoromethyl groups and a trifluoromethoxy group as a substituent).

In addition, preferred examples of the compound having a biphenyl skeleton and which fall under the compound represented by General Formula (I-a) include, among the compounds represented by General Formula (V-b), a compound in which $n^{31}$ is 1, $C^{31}$ is a 1,4-cyclohexylene group, and is a single bond, and $Y^{31}$ is a 1,4-phenylene group (the 1,4-phenylene group may have one or more of a fluorine atom, a chlorine atom, a methyl, group, a trifluoromethyl group and a trifluoromethoxy group as a substituent.

In addition, preferred examples of the compound having a biphenyl skeleton and which fall under the compound represented by General Formula (I-a) include, among the compounds represented by General Formula (VI-b), a compound in which $n^{51}$ is 0, $Y^{51}$ is a 1,4-phenylene group (the 1,4-phenylene group may have one or more of a fluorine atom, a chlorine atom, a methyl group, a trifluoromethyl group and a trifluoromethoxy group as a substituent), and $Z^{52}$ is a single bond.

In addition, preferred examples of the compound having a biphenyl skeleton and which fall under the compound represented by General Formula (I-a) include, among the compounds represented by General Formula (VIII-a), a compound in which $n^{61}$ is 1 or 2, one or more of $—C^{61}—Z^{61}—C^{61}—$, $—C^{61}—Z^{61}—C^{62}—$, and $—C^{62}—Z^{62}—C^{63}—$ are 1,4-cyclohexylene groups, and in the case where the 1,4-cyclohexylene group is one, the rest of all is a biphenyl skeleton (biphenyl group, or biphenyl group having one or more of a fluorine atom, a chlorine atom, a methyl group, a trifluoromethyl group and a trifluoromethoxy group as a substituent). However, in the case where $—C^{62}—Z^{62}—C^{62}—$ is a biphenyl skeleton, the content of the compound represented by General Formula (I-a) is 0 to 20% with respect to the total content of the liquid crystal compounds. In addition, in the case where $—C^{61}—Z^{61}—C^{62}—Z^{62}—C^{63}—$ is a terphenyl skeleton, the content of the compound represented by General Formula (VIII-a) is preferably 0 to 10% with respect to the total content of the liquid crystal compounds.

In addition, preferred examples of the compound having a biphenyl skeleton and which fall under the compound represented by General Formula (I-a) include, among the compounds represented, by General Formula (IX-a), a compound in which in the case where $n^{71}$ is 1 or 2, one or more of $—C^{71}—Z^{71}—C^{71}—$, $—C^{71}—Z^{71}—C^{72}—$, and $—C^{72}—Z^{72}—C^{73}—$ are 1,4-cyclohexylene groups, and in the case where the 1,4-cyclohexylene group is one, the rest of all is a biphenyl skeleton (biphenyl group, or biphenyl group having one or more of a fluorine atom, a chlorine atom, a methyl group, a trifluoromethyl group and a trifluoromethoxy group as a substituent). In the case where $—C^{71}—Z^{71}—C^{72}—Z^{72}—C^{73}—$ is a terphenyl skeleton, the content of the compound represented by General Formula (IX-a) is preferably 0 to 10% with respect to the total content of the liquid crystal compounds.

In the composite liquid crystal composition, the content of the compound having a biphenyl skeleton is 20% by mass or less and may be 0% by mass with respect to the total content of the liquid crystal compounds. In this way, if the content of the compound having a biphenyl skeleton is within the particular range from the viewpoint of decreasing an interaction (anchoring force) with liquid crystal molecules, in the composite liquid crystal composition, Δn (birefringence index) is sufficiently high, the viscosity is decreased, further the photostability is high, and the composition is suitable for a configuration of the liquid crystal device capable of being driven at a low voltage.

The composite liquid crystal composition may contain other liquid crystal compounds other than the compound having a biphenyl skeleton and the compound represented by General Formula (I-a). However, the ratio of the content of the other liquid crystal compounds is preferably 30% by mass or less, more preferably 20% by mass or less, still more preferably 15% by mass or less, and may be 0% by mass with respect to the total content of the liquid crystal compounds.

In the composite liquid crystal composition, the total content of the liquid crystal compounds (compound having a biphenyl skeleton, compound represented by General Formula (I-a), and other liquid crystal compounds) is preferably 65% to 85% by mass and 72% to 82% by mass. In this way, if the total content of the liquid crystal compounds is within the particular range, in the composite liquid crystal composition, Δn (birefringence index) is sufficiently high, further the photostability is high, and the composition is suitable for a configuration of the liquid crystal device capable of being driven at a low voltage.

The compounds represented by General Formulas (II-a1) and (II-a2), which are polymerizable compounds, are bifunctional acrylate. The compounds represented by General Formulas (II-a1) and (II-b) contained in the composite liquid crystal composition may be one type or two or more types.

In General Formulas (II-a1) and (II-a2), each $n^2$ independently is 3 to 14, in the case where two or more (a plurality of) types of the compound represented by General Formula (II-a1) or (II-a2) are used in combination, the average value of $n^2$ is preferably 6 to 8 and particularly preferably 7. If is preferable to use the compounds represented by General Formulas (II-a1) and (II-a2), from the viewpoint of a polymerization rate, compatibility with liquid crystal, and an interaction (anchoring force) with the liquid crystal molecules. It is preferable to use the compounds having a different n value at the same time.

Examples of the compound represented by General Formula (II-a1) include compounds represented by Formulas (II-a1-1) to (II-a1-12) shown below.

[Chem. 24]

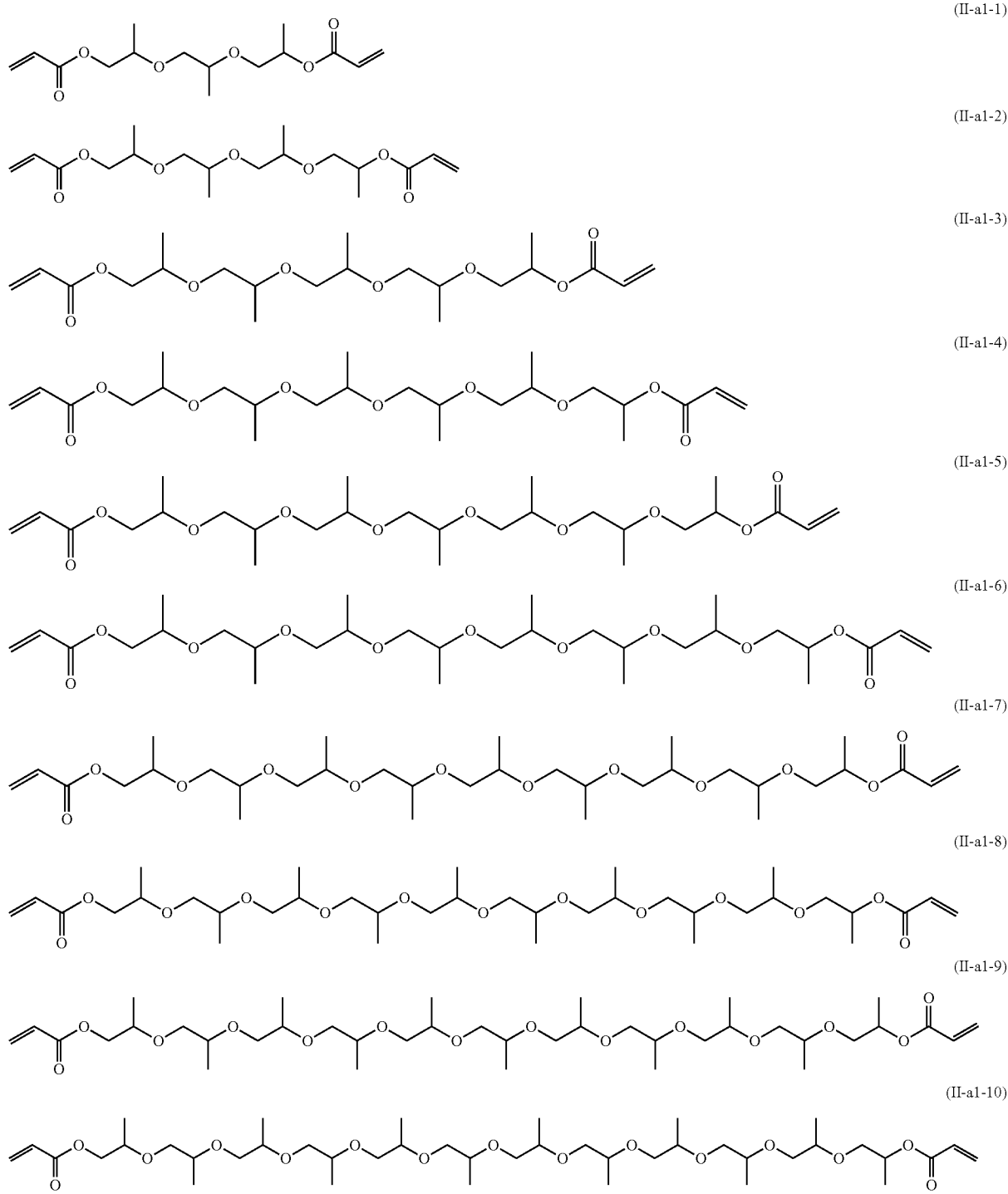

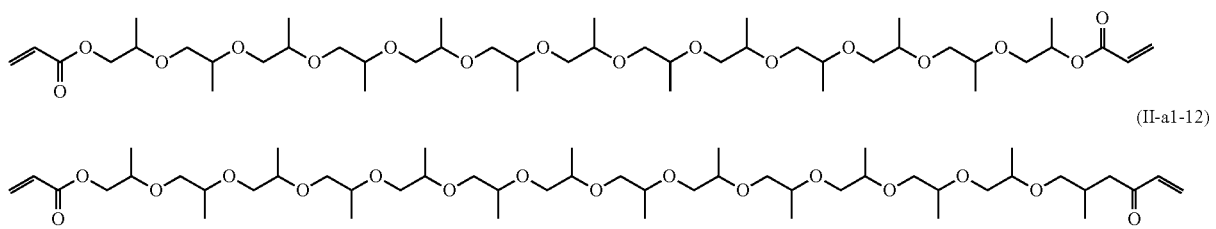
Examples of the compound represented by General Formula (II-a2) include compounds represented by Formulas (II-a2-1) to (II-a2-12) shown below.
[Chem. 25]
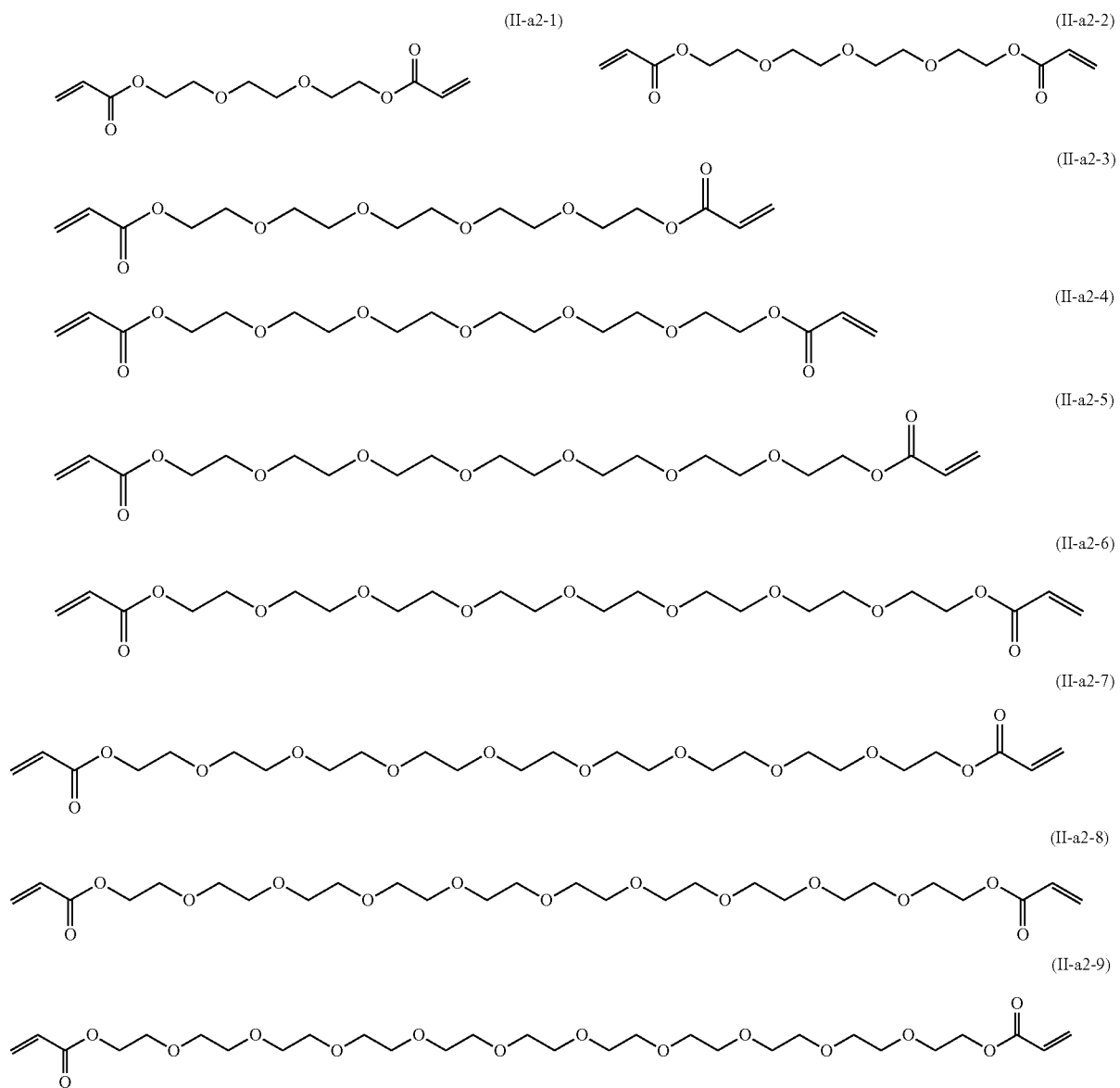

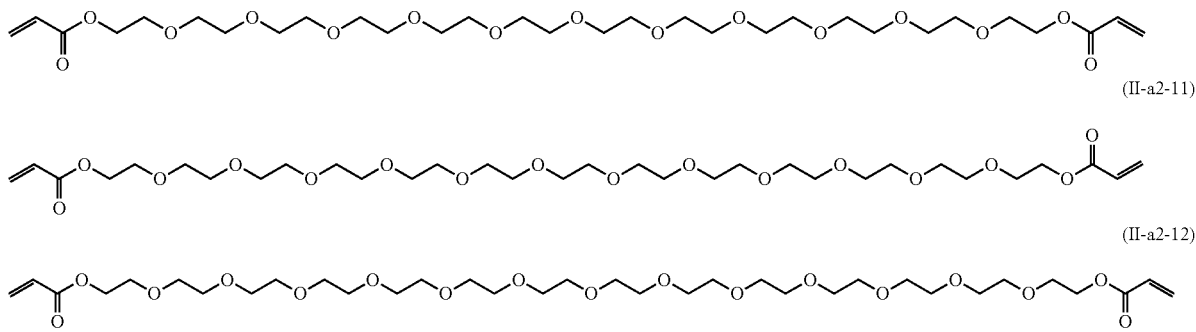

The compound represented by General Formula (II-b), which is a polymerizable compound, is monofunctional acrylate.

In General Formula (II-b), $B^1$ is preferably a hydrogen atom. Even if $B^1$ uses the compound represented by General Formula (II-b), which is a methyl group, the present invention exhibits an excellent effect. However, the compound, which is a hydrogen atom, is more advantageous because the polymerization rate is faster.

In General Formula (II-b), $B^2$ is preferably a single bond or an alkylene group having 1 to 3 carbon atoms.

In General Formula (II-b), $B^3$ and $B^4$ each independently preferably are an alkyl group having 3 to 11 carbon atoms.

In the case of a monofunctional monomer such as the compound represented by General Formula (II-b), a problem may occur, in which if the molecular weight is too small, the monomer volatilizes at the time of vacuum injection. Thus, the molecular weight of the compound represented by General Formula (II-b) is preferably 280 or more. Accordingly, a relationship among $B^2$, $B^3$, and $B^4$ is not completely independent. For example, in the case where $B^1$ is a hydrogen atom, $B^2$ is a methylene group, and $B^3$ is an octyl group, $B^4$ is preferably an alkyl group having 5 or more of carbon atoms.

The compound represented by General Formula (II-b) is preferably a bifurcated structure. The bifurcated structure herein means that $B^3$ and $B^4$ have the same structure or have a similar structure. Accordingly, it is not preferable that the lengths of $B^3$ and $B^4$ are extremely different. It is necessary that a difference in the lengths of $B^3$ and $B^4$ is within 8 in terms of the atom number, preferably within 6, more preferably within 4, and still more preferably within 2, and it is the most preferable that the lengths of $B^3$ and $B^4$ are the same as each other.

In addition, $B^3$ and $B^4$ are preferably an alkyl group having 4 to 10 carbon atoms and more preferably an alkyl group having 5 to 9 carbon works.

Meanwhile, $B^3$ and $B^4$ having a structure in which an alkyl group, an alkylether group, or an ester group is branched is not preferable in the present invention.

The compound represented by General Formula (II-b) is preferably a compound represented by General Formula (II-b1) shown below.

[Chem. 26]

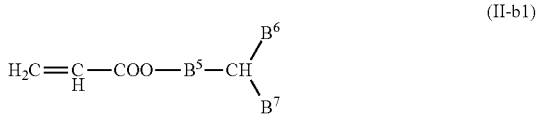

In the formula, $B^5$ represents a single bond or an alkylene group having 1 to 3 carbon atoms, and $B^6$ and $B^7$ each independently represent an alkyl group having 4 to 10 carbon atoms.

A commercial product of the compound represented by General Formula (II-b) can be easily obtained. In the case where the compound represented by General Formula (II-b) is synthesized, a known method, such as a method for reacting a compound having an epoxy group and a polymerizable compound which can react with an epoxy group, for example an acrylic acid, can be appropriately used.

The compound represented by General Formula (II-b) is preferably compounds represented by Formulas (II-c) to (II-z) and (II-aa) to (II-al) shown below.

[Chem. 27]

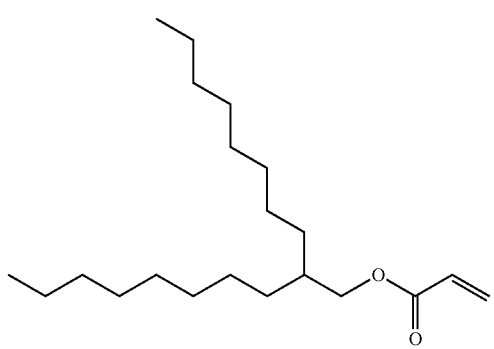

(II-d)
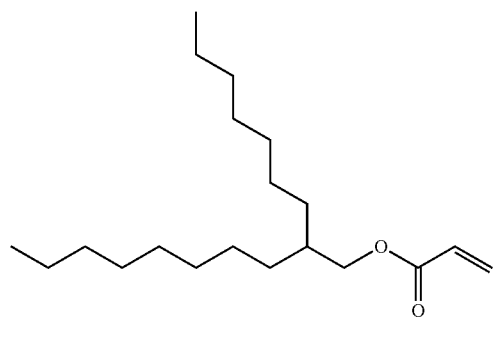
(II-e)
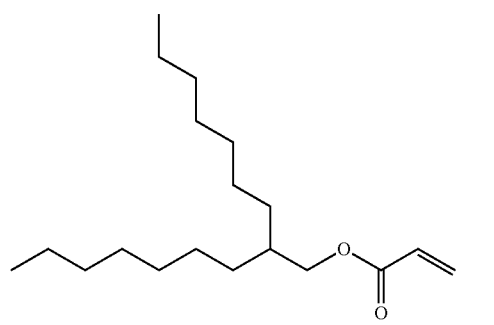
(II-f)
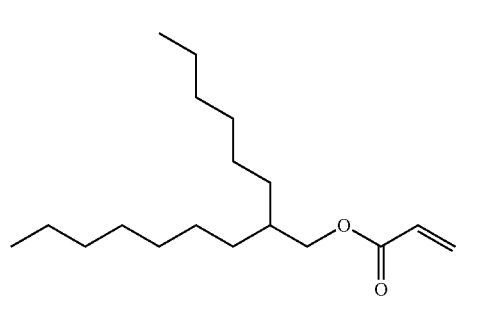
(II-g)
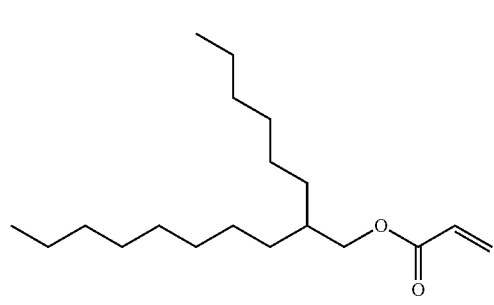
(II-h)
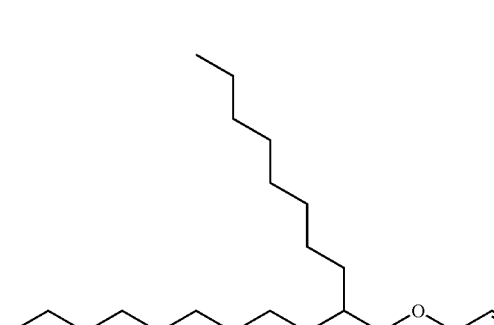
(II-i)
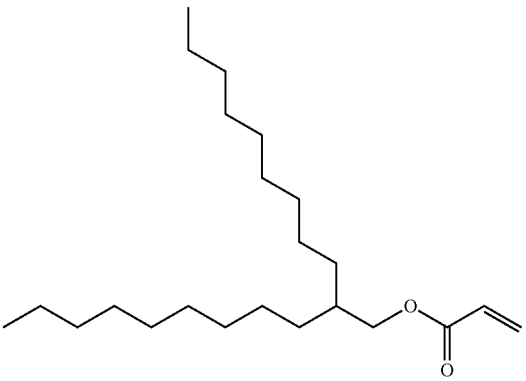
(II-j)
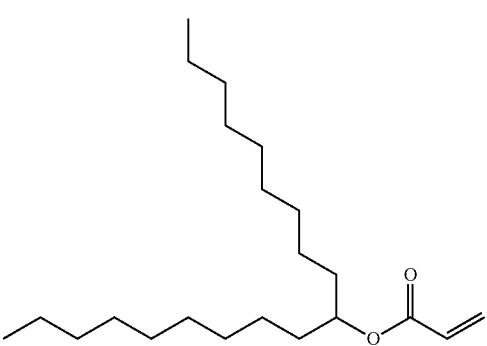
(II-k)
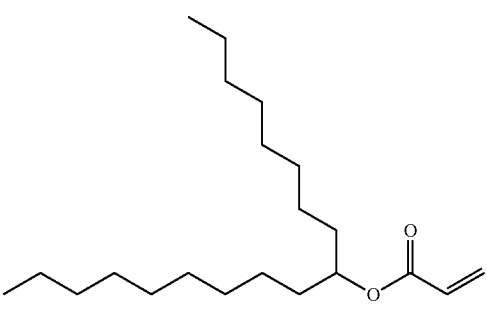
(II-l)
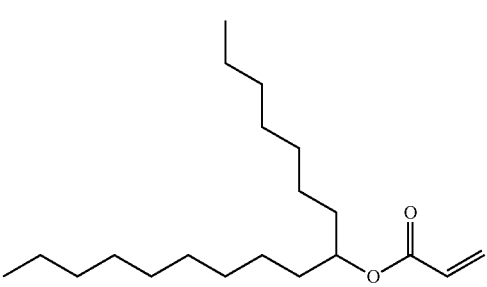

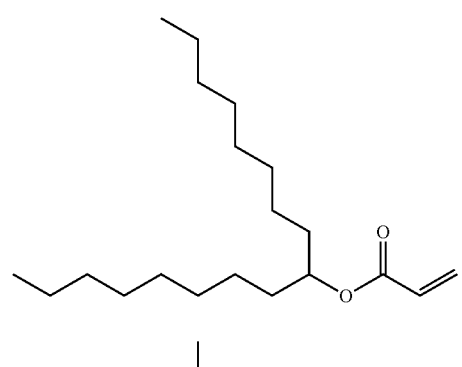
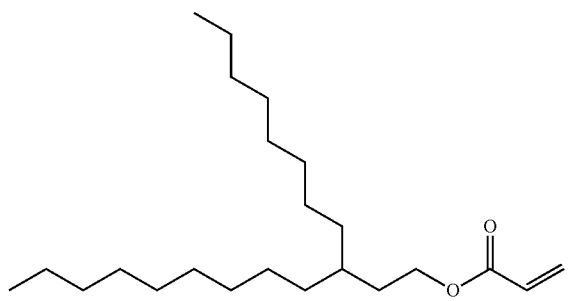
[Chem. 28]

(II-x)
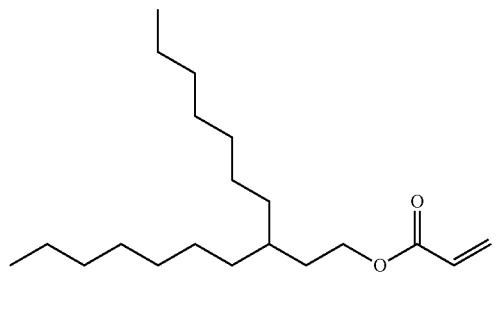
(II-y)
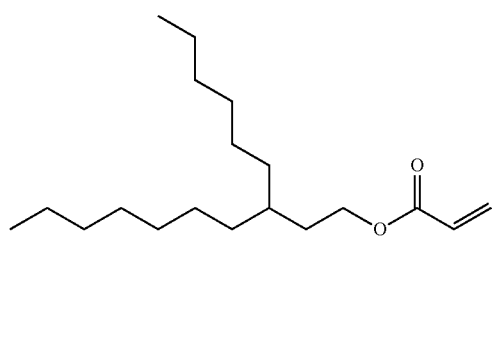
(II-z)
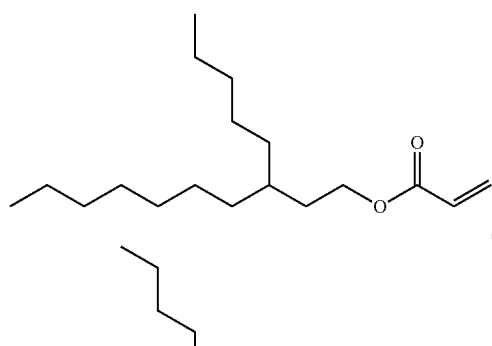
(II-aa)
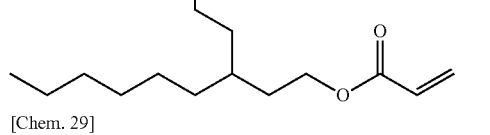
[Chem. 29]
(II-ab)
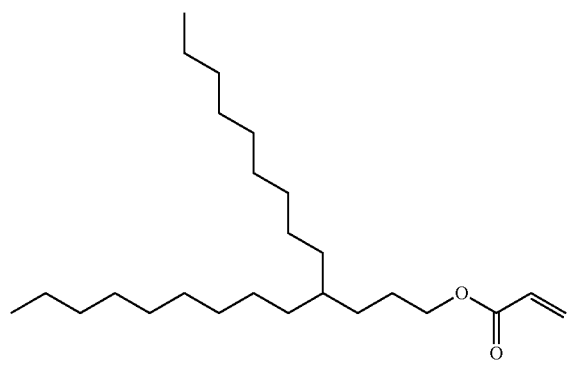
(II-ac)
(II-ad)
(II-ae)
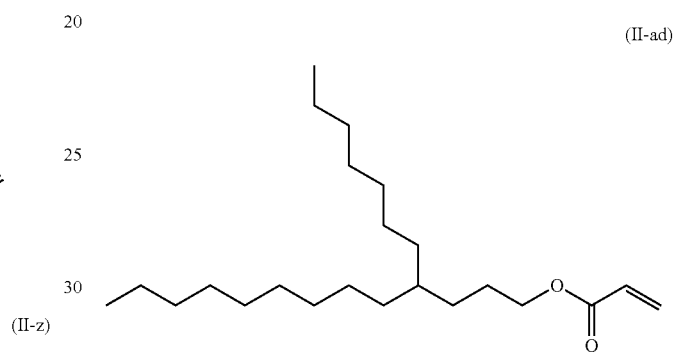
(II-af)
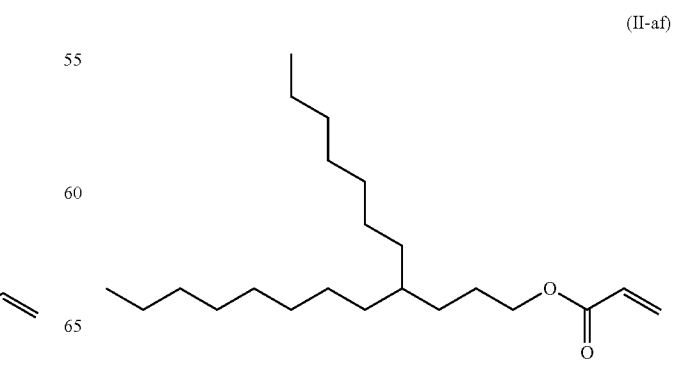

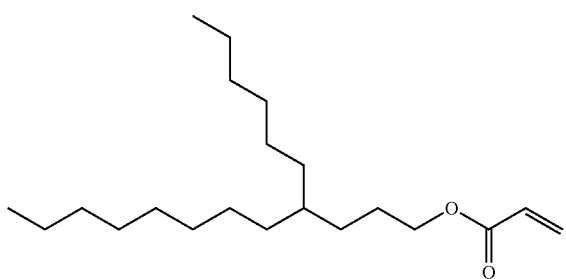

(II-ag)

(II-ah)

(II-ai)

(II-aj)

(II-ak)

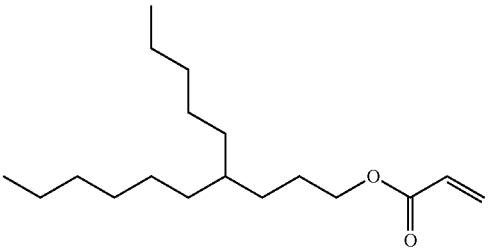

(II-al)

The compound represented by General Formula (II-b) contained in the composite liquid crystal composition may be one type or two or more types.

The composite liquid crystal composition contains the compound represented by General Formula (II-a) and the compound represented by General Formula (II-b), the ratio of the content (mass) of the compound represented by General Formula (II-a) to the compound represented by General Formula (II-b) is 70:30 to 30:70 and preferably 65:35 to 45:55. In this way, if the ratio of the content of these polymerizable compounds is within the particular range, in the element using the composite liquid crystal composition, the driving voltage can be sufficiently low and the light scattering properties can be sufficiently high, and further the photostability is increased and the interaction with the liquid crystal molecules is weakened, which is preferable, a form of a transparent polymeric substance described below formed in a liquid crystal layer strengthens light scattering, which is preferable, and thus the element is suitable for a configuration of the liquid crystal device capable of being driven at a low voltage.

The composite liquid crystal composition may contain other polymerizable compounds other than the compound represented by General Formula (II-a) and the compound represented by General Formula (II-b), but the ratio of the content of the other polymerizable compounds is preferably 10% by mass or less, more preferably 5% by mass or less, still more preferably 3% by mass or less, and may be 0% by mass with respect to the total content of the polymerizable compounds.

In the composite liquid crystal composition, the total content of the polymerizable compounds (compound represented by General Formula (II-a), compound represented by General Formula (II-b), and other polymerizable compounds) is 15% to 35% by mass or preferably 18% to 23% by mass. In this way, if the total content of the polymerizable compounds is within the particular range, in the element using the composite liquid crystal composition, the driving voltage can be sufficiently low and the light scattering properties are sufficiently high, further the photostability can be high, and thus the element is suitable for a configuration of the liquid crystal device.

Examples of the polymerization method of the polymerizable compounds include a radical polymerization, an anionic polymerization and a cationic polymerization, and the radical polymerization is preferable.

As a radical polymerization initiator, a thermopolymerization initiator and photopolymerization initiator can be used, but the photopolymerization initiator is preferably used.

Preferred examples of the photopolymerization initiator include an acetophenone-based photopolymerization initiator such as diethoxyacetophenone, 2-hydroxy-2-methyl-1-phenylpropane-1-one, benzyl dimethyl ketal (2,2-dimethoxy-1,2-diphenylethane-1-one), 1-(4-isopropylphenyl)-2-hydroxy-2-methylpropane-1-one, 4-(2-hydroxyethoxy)phenyl-2-hydroxy-2-propyl)ketone, 1-hydroxycyclohexyl-phenyl ketone, 2-methyl-2-morpholino (4-thiomethylphenyl)propane-1-one, and 2-benzyl-2-dimethylamino-1-(4-morpholinophenyl)-butanone;

a benzoin-based photopolymerization initiator such as benzoin, benzoin isopropyl ether and benzoin isobutyl ether;

a acylphosphine oxide-based photopolymerization initiator such as 2,4,6-trimethylbenzoyldiphenylphosphine oxide;

a benzyl, methylphenyl glyoxyester-based photopolymerization initiator;

a benzophenone-based photopolymerization initiator such as benzophenone, o-benzoyl benzoic acid methyl, 4-phenyl-benzophenone, 4'-dichlorobenzophenone, hydroxybenzophenone, 4-benzoyl-4'-methyl-diphenylsulfide, acrylated benzophenone, 3,3',4,4'-tetra(tert-butylperoxy carbonyl) benzophenone, and 3,3'-dimethyl-4-methoxybenzophenone;

a thioxanthone-based photopolymerization initiator such as 2-isopropylthioxanthone, 2,4-dimethylthioxanthone, 2,4-diethylthioxanthone, and 2,4-dichlorothioxanthone;

an aminobenzophenone-based photopolymerization initiator such as Michler ketone and 4,4'-diethylamino benzophenone;

10-butyl-2-chloroacridone; 2-ethyl anthraquinone; 9,10-phenanthrene quinone; and camphor quinone.

Among these, as the photopolymerization initiator, benzyl dimethyl, ketal is the most preferable.

In the case where the composite liquid crystal composition is used for driving a TFT, it is preferable to use a refined polymerization initiator.

In the composite liquid crystal composition, the content of the polymerization initiator is not particularly limited, but is preferably 0.1% to 2% by mass from the viewpoint of causing the polymerization to proceed smoothly.

The composite liquid crystal composition may contain other components (optional components) within the range not impairing the effect of the present invention, if necessary, in addition to the liquid crystal compounds, the polymerizable compounds, and the polymerization initiator.

Examples of the other components include an antioxidant, an ultraviolet absorber, an unreactive oligomer, an inorganic filler, an organic filler, a polymerization inhibitor, a defoaming agent, a leveling agent, a plasticizer, and a silane coupling agent.

In the case where the composite liquid crystal composition is used for driving a TFT, it is preferable to use the refined other components.

The content of the other components in the composite liquid crystal composition is preferably 10% by mass or less and more preferably 5% by mass or less.

In the composite liquid crystal composition, Δn (birefringence index) is sufficiently high and preferably can be 0.16 or more.

The polymerizable compound contained in the composite liquid crystal composition is polymerized by heat or active energy rays such as an ultraviolet ray, which causes a phase separation with the liquid crystal composition, and a composite liquid crystal composed of the transparent polymeric substance and the liquid crystal composition (for example, polymer/liquid crystal composite film) is formed. This composite liquid crystal is used, for example, for light scattering liquid crystal display element.

A driving voltage of the light scattering liquid crystal display element formed as the above is not determined only by a dielectric anisotropy or elastic constant of the nematic liquid crystal, composition, and is greatly affected by anchoring force acting on an interface of a polymer network formed in the composite liquid crystal, or between the polymer interface dispersed in the composite liquid crystal and the liquid crystal molecules.

For example, JP-A-6-222320 discloses the following relationship with regard to the driving voltage of the polymer dispersed liquid crystal display element.

$$Vth \propto \frac{d}{\langle r \rangle + {}^1Kii/A}\left(\frac{{}^2Kii}{\Delta\varepsilon}\right)^{\frac{1}{2}} \quad \text{[Equation 1]}$$

In the equation, Vth represents a threshold voltage, $^1Kii$ and $^2Kii$ represent an elastic constant, i represents 1, 2, or 3, $\Delta\in$ represents a dielectric anisotropy, <r> represents an average gap of voids at the interface of the transparent polymeric substance, A represents anchoring force of the transparent polymeric substance with respect to the liquid crystal composition, and d represents a distance between substrates having a transparent electrode.

According to the above, the driving voltage of the light scattering liquid crystal display element (composite liquid crystal element) is determined by an average gap of voids at the interface of the transparent polymeric substance, a distance between substrates, an elastic constant-dielectric anisotropy of the liquid crystal composition, and anchoring energy between the liquid crystal composition and the transparent polymeric substance. Among these, parameters which can be controlled by the composite liquid crystal composition of the present invention are anchoring force between liquid crystal physical properties and the transparent polymeric substance. Since the anchoring force greatly depends on the molecular structure of the polymer and the molecular structure of a low molecular liquid crystal, in order to realize a low driving voltage, which is 0.9 V/μm or less, it is necessary to specify the liquid crystal molecular structure for increasing the driving voltage and remove the structure. Meanwhile, as the physical properties of the liquid crystal composition for decreasing the driving voltage of the composite liquid crystal, it is preferable to set the dielectric anisotropy to be 6 or more and the birefringence index to be 0.16 or more. However, if the liquid crystal compound for increasing the anchoring force is removed, the necessary liquid crystal physical properties may not be obtained. Generally, a liquid crystal composition is adjusted such that the birefringence index or dielectric anisotropy required for the composite liquid crystal can be obtained, by using a compound group represented by General Formula (VIII-a) or a compound group represented by General Formula (IV-a). In this case, since the liquid crystal compound having a biphenyl group is frequently used, the driving voltage of the composite liquid crystal element is increased and it is difficult to obtain the driving voltage of 0.9 V/μm or less. Therefore, in order to realize the liquid crystal physical properties and low anchoring force at the same time necessary for decreasing the driving voltage of the composite liquid crystal element, it is more preferable to adjust the composition of the liquid crystal by appropriately combine the compound not having a biphenyl group and represented by General Formula (IV-a), the compound represented by General Formula (V-a) or (V-b), the compound represented by General Formula (VI-a) or (VI-b), the compound represented by General Formula (VIII-a), and the compound represented by General Formula (IX-a).

It is possible to prepare a polymer dispersed liquid crystal device by using the composite liquid crystal composition.

For example, the composite liquid crystal composition can be used as a liquid crystal material for a light scattering display, and it is possible to configure the light scattering display by forming a polymer/liquid crystal composite film. This polymer dispersed liquid crystal device can be driven at a low voltage and by a battery.

Next, the liquid crystal display element is exemplified and a method for preparing thereof will be described.

The polymer dispersed liquid crystal display element is obtained as follows: after the composite liquid crystal composition, which is an isotropic phase, is interposed between two pieces of substrates, each of which has an electrode and at least one of the substrates is a transparent substrate having a transparent electrode, the polymerizable compound is polymerized by heating or irradiating with active energy rays, which causes a phase separation with the liquid crystal composition, and a layer composed of the liquid crystal composition and the polymeric substance is formed.

As two pieces of the substrates, a transparent material having flexibility such as glass and plastic can be used and one of the substrates may be an opaque material such as silicon.

The transparent substrate having a transparent electrode layer can be prepared by sputtering indium tin oxide (ITO) on the transparent base material such as a glass plate. In addition, by using a transparent substrate having low wavelength dispersion, a light scattering ability of the device is increased and reflectivity or contrast is improved, which is preferable. Examples of the transparent substrate having low wavelength dispersion include a plastic transparent film such as a borosilicate glass, polyethylene terephthalate and polycarbonate; and a transparent substrate coated with a dielectric multilayer using an optical interference condition of $1/4\lambda$.

In addition, it is possible to dispose a polymeric film, an alignment film, or a color filter on the substrate, if necessary.

Examples of the alignment film include a polyimide alignment film and a photo-alignment film. An the method for forming an alignment film, in the case of a polyimide alignment film, a method can be exemplified, in which a polyimide resin composition is applied on the transparent base material, cured by heating at a temperature of 180° C. or more, and further subjected to a rubbing process with a cotton or rayon cloth. In addition, a polymeric film such as a polyimide film which has not been subjected to the rubbing process can be used. These films improve the surface of the substrate to increase adhesiveness to the polymeric transparent substance in the composite liquid crystal phase, or useful as a measurement for light scattering unevenness.

The color filter can be prepared by, for example, a pigment dispersing method, a printing method, an electrode-position method, or a dyeing method. If the method for preparing a color filter by the pigment dispersing method as one example, first, a curable coloring composition for a color filter is applied to a transparent base material, subjected to a patterning process, and cured by heating or irradiating with light. By respectively conducting this process for three colors such as red, green, and blue, a pixel unit for a color filter can be prepared. In addition, a pixel electrode may be provided on the substrate, which is provided with an active element, such as a TFT, a thin film diode, a metal insulator, and a metal specific resistance element.

Next, the substrates are faced to each other so as for the transparent electrode layer to be inside. At this time, a gap between the substrates may be adjusted via a spacer. Examples of the spacer include glass particles, plastic particles, alumina particles, and a photoresist material.

Next, a sealant such as an epoxy-based thermosetting composition is screen-printed on the substrate in the form where a liquid crystal injection port is provided, and the substrates are attached to each other and heated to thermally cure the sealant.

Examples of the method for interposing a composition for a polymer dispersed liquid crystal display element between two pieces of the substrates include, commonly, a vacuum injection method and an ODF method. At this time, the composite liquid crystal composition is preferably in a uniform isotropic state.

The polymerizable compound, which is radically polymerizable, is preferably polymerized by irradiation with an ultraviolet ray.

As a lamp for generating the ultraviolet ray, it is possible to use a metal halide lamp, a high pressure mercury lamp, an ultrahigh pressure mercury lamp, and the like. In addition, the wavelength of the ultraviolet ray to be irradiated is preferably in the same wavelength region absorbing the photopolymerization initiator contained in the composite liquid crystal composition, but not in the same wavelength region absorbing the liquid crystal composition contained in the composite liquid crystal composition. For example, the polymerizable compound may be irradiated with the ultraviolet ray by preferably cutting the ultraviolet ray in the wavelength of 330 nm or less and more preferably in the wavelength of 350 nm or less, using the metal halide lamp, the high pressure mercury lamp, and the ultrahigh pressure mercury lamp.

The irradiation intensity of the ultraviolet ray may be appropriately adjusted according to the purpose, but generally is preferably 1 to 200 $mW/cm^2$ and more preferably 2 to 100 $mW/cm^2$.

The irradiation time of the ultraviolet ray may be appropriately set according to the irradiation intensity of the ultraviolet ray, but generally is preferably 10 to 600 seconds. The ultraviolet ray exposing apparatus includes a shutter function, preferably irradiates the ultraviolet ray on the entire surfaces of the composite liquid crystal element to be prepared uniformly and all at once by opening a shutter at the time of starting exposure, and it is preferable to perform exposure such that the intensity of the ultraviolet ray is constant while the shutter is open.

The temperature at the time of irradiation with the ultraviolet ray is preferably, for example, a temperature slightly higher than the isotropic-nematic transition point of the composite liquid crystal composition, preferably a temperature of the transition point+0.1° C. to 10° C., and more preferably a temperature of the transition point+0.1° C. to 3° C. In the case where the temperature of the composite liquid crystal element is increased by exposure to the ultraviolet ray, it is preferable to expose the element through an infrared ray cut filter and further use the apparatus including a plate which can control the temperature as the ultraviolet ray exposing apparatus, such that the temperature of the composite liquid crystal element is not increased.

The liquid crystal layer formed by using the composite liquid crystal composition has a structure in which the liquid crystal composition is embedded by the transparent polymeric substance in a capsule shape, a structure in which a three-dimensional network structure of the transparent polymeric substance is formed in a continuous phase of the liquid crystal composition, or a structure in which these structures are mixed, but is preferably a structure in which a three-dimensional network structure of the transparent polymeric substance is formed in a continuous phase of the liquid crystal composition, and more preferably a structure in which a three-dimensional network structure of the transparent polymeric substance is formed in a continuous phase of the liquid crystal composition by irradiation with the ultraviolet ray. The average void gap of the network structure is greatly affected by properties of the polymer dispersed liquid crystal device, and the average void gap is preferably 0.2 to 2 µm, more preferably 0.2 to 1 µm, and the most preferably 0.3 to 0.7 µm.

A light absorbing layer or a diffuse reflector is disposed on the rear surface side of the polymer dispersed liquid crystal display element, and it is possible to form a reflective polymer dispersed liquid crystal display element having high reflectivity and contrast.

In addition, the polymer dispersed liquid crystal display element enables a color display by disposing the light absorbing layers having different light absorbing wavelengths such as cyan, magenta, and yellow so as to be positioned on pixel electrodes part it lively formed for respective colors.

Further, functions such as specular reflection, diffuse reflection, recursive reflection, and hologram reflection can be added to the polymer dispersed liquid crystal display element.

The polymer dispersed liquid crystal display element using the composite liquid crystal composition has sufficiently high photostability and can be driven at a low voltage.

For example, transmittance T0 is measured in a state where a voltage is not applied, an alternating current voltage of 60 Hz is added at a rate of 0.2 V/3 seconds from the state where the voltage is not applied, when the transmittance is not changed any more even if the applied voltage is increased, T99(%) defined in the following equation is obtained by measuring the transmittance T100(%). In this way, when the alternating current voltage is added at a rate of 0.2 V/3 seconds from the state where the voltage is not applied, in the case where the applied voltage V99 (V) in which the transmittance is T99 is obtained, the value is preferably 5 V or less in the case of where the cell thickness is 8 µm. Also, at this time, T0 is preferably 20% or less. The polymer dispersed liquid crystal display element is appropriate for battery driving, and does not need a booster circuit, different from the conventional polymer dispersed liquid crystal display element.

$$T99=T0+0.99\times(T100-T0)$$

Meanwhile, examples of the polymer dispersed liquid crystal device include a display element using a light scattering change and a sensor of an electric field detector.

In the conventional polymer dispersed liquid crystal display element and electric field detector, responsive field intensity is about 2 V/µm and the sensitivity is low. However, in the polymer dispersed liquid crystal electric field detector using the composite liquid crystal composition, the responsive electric field intensity is less than 2 V/µm, preferably 1 V/µm or less, and for example, may be about 0.5 V/µm, and the sensitivity is high.

A sensor of the electric field detector using the composite liquid crystal composition (electric field detecting unit) can be configured in the same manner as the sensor of the conventional electric field detector except that the composite liquid crystal composition is used instead of the conventional liquid crystal composition. Examples of this sensor of the electric field detector include sensors in which the transparent substrate, the transparent electrode, the polymer/liquid crystal composite film, and the transparent substrate are provided in this order, and the transparent electrode is capable of being grounded. This sensor of the electric field detector is characterized in that liquid crystal molecules are aligned in an electric field direction by electrostatic induction such that a potential difference between the grounded substrate and a part to be detected is generated, a light-scattered part becomes transparent because the liquid crystals are aligned by an electric field, and a space electric field distribution released from the part to be detected within the sensor surface is detected as a transparent image. It is possible to increase the sensitivity of this sensor by reducing anchoring force occurring between the transparent polymeric substance and the liquid crystal molecules. This electric field detector can be used for, for example, examining high voltage power generating/transforming equipment or an electric part.

EXAMPLES

Hereinafter, the present invention will be further described in detail using Examples and Comparative Examples, but the present invention is not limited to these Examples.

Examples 1 to 5 and Comparative Examples 1 to 4

The liquid crystal compounds (total amount: 76 parts by mass) each having a content (% by mass) shown in Table 1 and the polymerizable compounds (total amount: 23.52 parts by mass) each having a content (% by mass) shown in Table 2 were mixed, and further IRGACURE 651 (benzyl dimethyl ketal, 0.48 parts by mass) were mixed therein as a polymerization initiator to prepare a composite liquid crystal composition.

In addition, the content of each of the liquid crystal compounds in Table 1 is a value with respect to the total content (100% by mass) of the liquid crystal compounds. Also, the content of each of polymerizable compounds in Table 2 is a value with respect to the total content (100% by mass) of the polymerizable compounds.

An isotropic phase-nematic phase transition point (° C.), a melting point (° C.). Δn (birefringence index), a TN mode threshold value, and Δ∈ (dielectric anisotropy) were measured with respect to the obtained composite liquid crystal composition. The result is shown in Table 3.

The composite liquid crystal composition was injected into a glass cell with an ITO electrode, having a cell thickness of 8 µm by a vacuum injection method, and an injection port was sealed.

Next, the composition was irradiated with the ultraviolet, ray having an intensity of 10 mW/cm$^2$ for 60 seconds at a temperature higher than the isotropic-nematic transition point by 1° C. to 2° C., and the polymerizable compound was polymerized to form a polymer/liquid crystal composite film from the composite liquid crystal composition, thereby preparing a polymer dispersed liquid crystal device.

Next, the transmittance T0 and T100 were measured with respect to the obtained liquid crystal device according to the method described previously to obtain T99 and V99. The obtained T0 and V99 are shown in Table 3.

In addition, structures of the liquid crystal compounds of which each abbreviated symbol in Table 1 is affixed are shown below. In these liquid crystal compounds, the alkyl groups bonded to the terminal are all linear (n-).

Among these liquid crystal compounds, the compound having a biphenyl skeleton are the compounds having abbreviated symbols of LC3, LC6, LC13, LC14, and LC15.

In addition, the compounds represented by General Formula (I-a) in which $C^1$ is a 1,4-cyclohexylene group are the compounds having abbreviated symbols of LC4, LC5, and LC7 to 13.

[Chem. 30]

In addition, the compound represented by General Formula (II-a) in which the average value of $n^2$ was adjusted to 7 was used.

TABLE 1

| Liquid crystal compound | Comparative Example 1 | Example 1 | Comparative Example 2 | Comparative Example 3 | Comparative Example 4 | Example 2 | Example 3 | Example 4 | Example 5 |
|---|---|---|---|---|---|---|---|---|---|
| LC1 | 20 | 20 | 20 | 20 | 20 | 20 | 15 | 20 | 20 |
| LC2 | — | 12.5 | 12.5 | 12.5 | 12.5 | 8.75 | 17 | 10 | 10 |
| LC3 | 25 | 12.5 | 12.5 | 12.5 | 12.5 | 8.75 | — | 10 | 10 |
| LC4 | 15 | 15 | — | 15 | 15 | 11.5 | — | 20 | 10 |
| LC5 | — | — | — | — | — | 11.5 | — | — | 10 |
| LC6 | — | — | 15 | — | — | — | — | — | — |
| LC7 | 19 | 19 | 19 | 19 | 19 | 20.9 | 15 | 19 | 19 |
| LC8 | — | — | — | — | — | — | 12 | — | — |
| LC9 | — | — | — | — | — | — | 12 | — | — |
| LC10 | — | — | — | — | — | — | 9 | — | — |
| LC11 | 10 | 10 | 10 | — | — | 8.75 | 9 | 10 | 10 |
| LC12 | 10 | 10 | 10 | 10 | 10 | 8.75 | 11 | 10 | 10 |
| LC13 | 1 | 1 | 1 | 1 | 1 | 1.1 | — | 1 | 1 |
| LC14 | — | — | — | 10 | — | — | — | — | — |
| LC15 | — | — | — | — | 10 | — | — | — | — |
| Total | 100 | 100 | 100 | 100 | 100 | 100 | 100 | 100 | 100 |

TABLE 2

| Polymerizable compound | Comparative Example 1 | Example 1 | Comparative Example 2 | Comparative Example 3 | Comparative Example 4 | Example 2 | Example 3 | Example 4 | Example 5 |
|---|---|---|---|---|---|---|---|---|---|
| Compound represented by General Formula (II-a) (a mixture of the compounds in which $n^2$ is 4 to 14) | 60 | 60 | 60 | 60 | 60 | 60 | 60 | 60 | 60 |
| Compound represented by Formula (II-b) | 40 | 40 | 40 | 40 | 40 | 40 | 40 | 40 | 40 |
| Total | 100 | 100 | 100 | 100 | 100 | 100 | 100 | 100 | 100 |

TABLE 3

| | | Comparative Example 1 | Example 1 | Comparative Example 2 | Comparative Example 3 | Comparative Example 4 | Example 2 | Example 3 | Example 4 | Example 5 |
|---|---|---|---|---|---|---|---|---|---|---|
| Content with respect to the total content of the liquid crystal compound | (a) compound having a biphenyl skeleton (% by mass) | 25 | 12.5 | 27.5 | 22.5 | 22.5 | 8.75 | 0 | 10 | 10 |
| | (b) compound represented by General Formula (I-a) in which $C^1$ is a 1,4-cyclohexylene group (% by mass) | 55 | 55 | 40 | 45 | 45 | 62.5 | 68 | 60 | 60 |
| | (b) − (a) | 30 | 42.5 | 12.5 | 12.5 | 2.5 | 53.8 | 68 | 50 | 50 |
| Physical properties of composite liquid crystal composition | Isotropic phase-nematic phase transition point (° C.) | 67 | 71 | 65 | 70 | 70 | 79 | 85 | 80 | 75 |
| | Melting point (° C.) | −30 | −39 | −34 | −29 | −26 | −41 | −33 | −32 | −41 |
| | Δn (birefringence index) | 0.15 | 0.16 | 0.17 | 0.17 | 0.17 | 0.16 | 0.19 | 0.17 | 0.16 |
| | TN mode threshold value | 1.7 | 1.8 | 1.9 | 1.8 | 1.8 | 1.7 | 1.9 | 1.8 | 1.7 |
| | Δε (dielectric anisotropy) | 7.0 | 7.3 | 8.7 | 7.4 | 7.9 | 9.7 | 7.2 | 8.8 | 8.8 |
| Propertes of liquid crystal device | TO (%) | 25.2 | 5.9 | 35.0 | 26.3 | 27.2 | 13.3 | 4.7 | 11.5 | 15.5 |
| | V99 (V) | 6.7 | 4.5 | 5.5 | 9.2 | 8.1 | 4.8 | 3.2 | 3.7 | 4.2 |

The liquid crystal compound having a biphenyl skeleton has aft effect of increasing a driving voltage V99, and the compound represented by General Formula (I-a) in which $C^1$ is a 1,4-cyclohexylene group has an effect of decreasing a driving voltage V99. The driving voltage V99 is decreased if (a) the content of the liquid crystal compound having a phenyl skeleton is small, and (b) the content of the compound represented by General Formula (I-a) in which $C^1$ is a 1,4-cyclohexylene group is large. Therefore, a (b)–(a) difference was noted in Table 3. If this difference is 40% or more and the (b) compound group is contained more than the (a) compound group, the driving voltage is decreased.

As clear from the above results, in Examples 1 to 5, Δn of the composite liquid crystal composition was 0.16 or more, which is sufficiently high. Also, in Examples 1 to 5, all of T0 and V99 were lower than those in Comparative Examples 1 to 4, the photostability was sufficiently high, and a low voltage driving was possible.

The invention claimed is:

1. A composite liquid crystal composition that contains a liquid crystal compound and a polymerizable compound, the composition comprising:

as the liquid crystal compound,
a compound having a biphenyl skeleton including two or three rings, and
two or more compounds represented by General Formula (I-a) shown below other than the compound having a biphenyl skeleton,

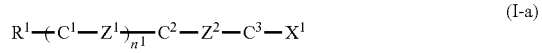

(I-a)

wherein $R^1$ represents an alkyl group having 1 to 10 carbon atoms or an alkenyl group having 2 to 10 carbon atoms, and one or more methylene groups existing in the alkyl group or the alkenyl group may be substituted with an oxygen atom, provided that the oxygen atoms are not directly bonded to each other, $C^1$ represents a 1,4-phenylene group, a 1,4-cyclohexylene group, a 1,3-dioxane-2,5-diyl group, a pyran-1,4-diyl group, or an indane-2,5-diyl group, and the 1,4-phenylene group may be unsubstituted or may have one or more of a fluorine atom, a chlorine atom, a methyl group, an methoxy groups, an ethyl group, a trifluoromethyl group and a trifluoromethoxy group as a substituent, $C^2$ and $C^3$ each independently represent a 1,4-phenylene group, a 1,4-cyclohexylene group, a decahydronaphthalene-2,6-diyl group, a 1,2,3,4-tetrahydronaphthalene-2,6-diyl group, a 2,6-naphthylene group, or an indane-2,5-diyl group, and the 1,4-phenylene group, the 1,2,3,4-tetrahydronaphthalene-2,6-diyl group, the 2,6-naphthylene group, or the indane-2,5-diyl group may be unsubstituted or may have one or more of a fluorine atom, a chlorine atom, a methyl group, a methoxy group, an ethyl group, a trifluoromethyl group and a trifluoromethoxy group as a substituent, $Z^1$ and $Z^2$ each independently represent a single bond, —$CH_2CH_2$—, —C≡C—, —$CF_2O$—, —COO—, or —OCO—, and, in the case where $C^2$ and $C^3$ represent a 1,4-phenylene group, $Z^2$ represents —$CH_2CH_2$—, —C≡C—, —$CF_2O$—, —COO—, or —OCO—, $X^1$ represents an alkyl group having 1 to 10 carbon atoms, an alkenyl group having 2 to 10 carbon atoms, a fluorine atom, a chlorine atom, a trifluoromethyl group, a trifluoromethoxy group, a difluoromethyl group or an isocyanate group, and one or more methylene groups existing in the alkyl group or the alkenyl group may be substituted with an oxygen atom, provided that the oxygen atoms are not directly bonded to each other, and $n^1$ represents 0, 1, or 2, provided that, in the case where $n^1$ is 2, $C^1$ and $Z^1$ which exist in a plurality of numbers respectively may be the same as or different from each, in which the content of the compound having a biphenyl skeleton is 20% by mass or less with respect to the total content of the liquid crystal compounds, and, with respect to the compounds represented by General Formula (I-a), the content of the compound in which C' represents a 1,4-cyclohexylene group and n' is not 0 is 45% by mass or more with respect to the total content of the liquid crystal compounds; and as the polymerizable compound,
one or more compounds selected from the compounds represented by General Formulas (II-a1) and (II-a2) shown below,

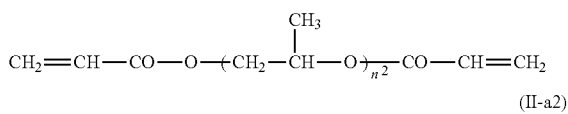

(II-a1)

(II-a2)

wherein $n^2$ each independently represent an integer of 3 to 14, and a compound represented by General Formula (II-b) shown below,

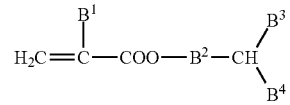

(II-b)

wherein $B^1$ represents a hydrogen atom or a methyl group, $B^2$ represents a single bond or an alkylene group having 1 to 3 carbon atoms, one or more methylene groups existing in the alkylene group may be substituted with an oxygen atom, —CO—, —COO—, or —OCO—, provided that the oxygen atoms are not directly bonded to each other, and one or more hydrogen atoms existing in the alkylene group may be substituted with a fluorine atom, and $B^3$ and $B^4$ each independently represent an alkyl group having 3 to 11 carbon atoms, one or more methylene groups existing in the alkyl group may be substituted with an oxygen atom, —CO—, —COO—, or —OCO—, provided that the oxygen atoms are not directly bonded to each other and one or more hydrogen atoms existing in the alkyl group may be substituted with a fluorine atom, in which the ratio of the content (mass) of the one or more compounds selected from the compounds represented by General Formulas (II-a1) and (II-a2) to the compound represented by General Formula (II-b) is 70:30 to 30:70, the total content of the liquid crystal compounds being 65% to 85% by mass, and the total content of the polymerizable compounds being 15% to 35% by mass.

2. A display element provided with a transparent substrate, a transparent electrode, a polymer/liquid crystal composite film, and a transparent substrate in this order,
 wherein the transparent electrode is capable of being grounded, and the polymer/liquid crystal composite film is formed by using the composite liquid crystal composition according to claim 1.

3. An electric field detector comprising:
 an electric field detecting unit provided with a transparent substrate, a transparent electrode, a polymer/liquid crystal composite film, and a transparent substrate in this order,
 wherein the transparent electrode is capable of being grounded, and the polymer/liquid crystal composite film is formed by using the composite liquid crystal composition according to claim 1.

* * * * *